*(12)* United States Patent
Redaelli et al.

(10) Patent No.: US 9,755,145 B2
(45) Date of Patent: Sep. 5, 2017

(54) MEMORY ARRAYS HAVING CONFINED PHASE CHANGE MATERIAL STRUCTURES LATERALLY SURROUNDED WITH SILICON NITRIDE

(71) Applicant: Micron Technology, Inc., Boise, ID (US)

(72) Inventors: Andrea Redaelli, Casatenovo (IT); Giorgio Servalli, Fara Gera D'Adda (IT); Carmela Cupeta, Milan (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/279,158

(22) Filed: Sep. 28, 2016

(65) Prior Publication Data

US 2017/0018708 A1      Jan. 19, 2017

Related U.S. Application Data

(62) Division of application No. 14/799,467, filed on Jul. 14, 2015, now Pat. No. 9,484,536, which is a division of application No. 13/948,980, filed on Jul. 23, 2013, now Pat. No. 9,112,150.

(51) Int. Cl.
*H01L 45/00* (2006.01)
*H01L 27/24* (2006.01)

(52) U.S. Cl.
CPC ...... *H01L 45/1293* (2013.01); *H01L 27/2463* (2013.01); *H01L 45/06* (2013.01); *H01L 45/065* (2013.01); *H01L 45/126* (2013.01); *H01L 45/1233* (2013.01); *H01L 45/1286* (2013.01); *H01L 45/141* (2013.01); *H01L 45/144* (2013.01); *H01L 45/1608* (2013.01); *H01L 45/1666* (2013.01); *H01L 45/1675* (2013.01)

(58) Field of Classification Search
None
See application file for complete search history.

(56) References Cited

U.S. PATENT DOCUMENTS

| | | |
|---|---|---|
| 7,824,954 B2 | 11/2010 | An et al. |
| 8,168,479 B2 | 5/2012 | Ha |
| 8,569,734 B2 | 10/2013 | Redaelli et al. |
| 8,822,969 B2 | 9/2014 | Hwang |
| 8,853,665 B2 | 10/2014 | Pellizzer et al. |

(Continued)

*Primary Examiner* — Andres Munoz
(74) *Attorney, Agent, or Firm* — Wells St. John P.S.

(57) ABSTRACT

Some embodiments include methods of forming memory cells. Heater structures are formed over an array of electrical nodes, and phase change material is formed across the heater structures. The phase change material is patterned into a plurality of confined structures, with the confined structures being in one-to-one correspondence with the heater structures and being spaced from one another by one or more insulative materials that entirely laterally surround each of the confined structures. Some embodiments include memory arrays having heater structures over an array of electrical nodes. Confined phase change material structures are over the heater structures and in one-to-one correspondence with the heater structures. The confined phase change material structures are spaced from one another by one or more insulative materials that entirely laterally surround each of the confined phase change material structures.

5 Claims, 21 Drawing Sheets

(56) References Cited

U.S. PATENT DOCUMENTS

| | | | |
|---|---|---|---|
| 8,871,559 B2 | 10/2014 | Horii et al. | |
| 2003/0186481 A1* | 10/2003 | Lung | G11C 11/56 438/95 |
| 2007/0020797 A1 | 1/2007 | Pellizzer et al. | |
| 2009/0001337 A1* | 1/2009 | Furukawa | H01L 27/2454 257/2 |
| 2009/0017577 A1 | 1/2009 | An et al. | |
| 2010/0200830 A1 | 8/2010 | Liu et al. | |
| 2010/0308296 A1 | 12/2010 | Pirovano et al. | |
| 2010/0320435 A1* | 12/2010 | Tu | H01L 27/2409 257/4 |
| 2010/0327251 A1 | 12/2010 | Park | |
| 2011/0001114 A1 | 1/2011 | Zanderighi et al. | |
| 2011/0300685 A1 | 12/2011 | Horii et al. | |
| 2012/0267597 A1 | 10/2012 | Lung | |
| 2015/0280117 A1 | 10/2015 | Boniardi | |

* cited by examiner

US 9,755,145 B2

MEMORY ARRAYS HAVING CONFINED PHASE CHANGE MATERIAL STRUCTURES LATERALLY SURROUNDED WITH SILICON NITRIDE

RELATED PATENT DATA

This patent resulted from a divisional of U.S. patent application Ser. No. 14/799,467, which was filed Jul. 14, 2015, and which is hereby incorporated herein by reference; which resulted from a divisional of U.S. patent application Ser. No. 13/948,980, which was filed Jul. 23, 2013, which issued as U.S. Pat. No. 9,112,150, and which is hereby incorporated herein by reference.

TECHNICAL FIELD

Memory cells, memory arrays, and methods of forming memory cells and arrays.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

One type of memory is phase change memory (PCM). Such memory utilizes phase change material as a programmable material. Example phase change materials that may be utilized in PCM are chalcogenide materials.

The phase change material reversibly transforms from one phase to another through application of appropriate stimulus. Each phase may be utilized as a memory state, and thus an individual PCM cell may have two selectable memory states that correspond to two inducible phases of the phase change material.

The electrical stimulus utilized to transform PCM from one phase to another may have an associated "programming current" which is a minimal current suitable for achieving the desired transformation. It can be desired to develop memory cells having reduced programming current relative to conventional memory cells in order to, for example, extend battery life of portable electronics, reduce overall current requirements of integrated memory circuitry, etc.

PCM may be incorporated into memory arrays. Problems may be encountered with thermal disturbance (i.e., crosstalk) between adjacent PCM cells within a memory array. It is desired to reduce or eliminate such thermal disturbance.

It is desired to develop new PCM architectures which may reduce programming current relative to conventional architectures, and/or which may reduce thermal disturbance relative to conventional architectures. Also, it is desired to develop methods of forming the new PCM architectures.

DETAILED DESCRIPTION OF THE ILLUSTRATED EMBODIMENTS

Figure 1:
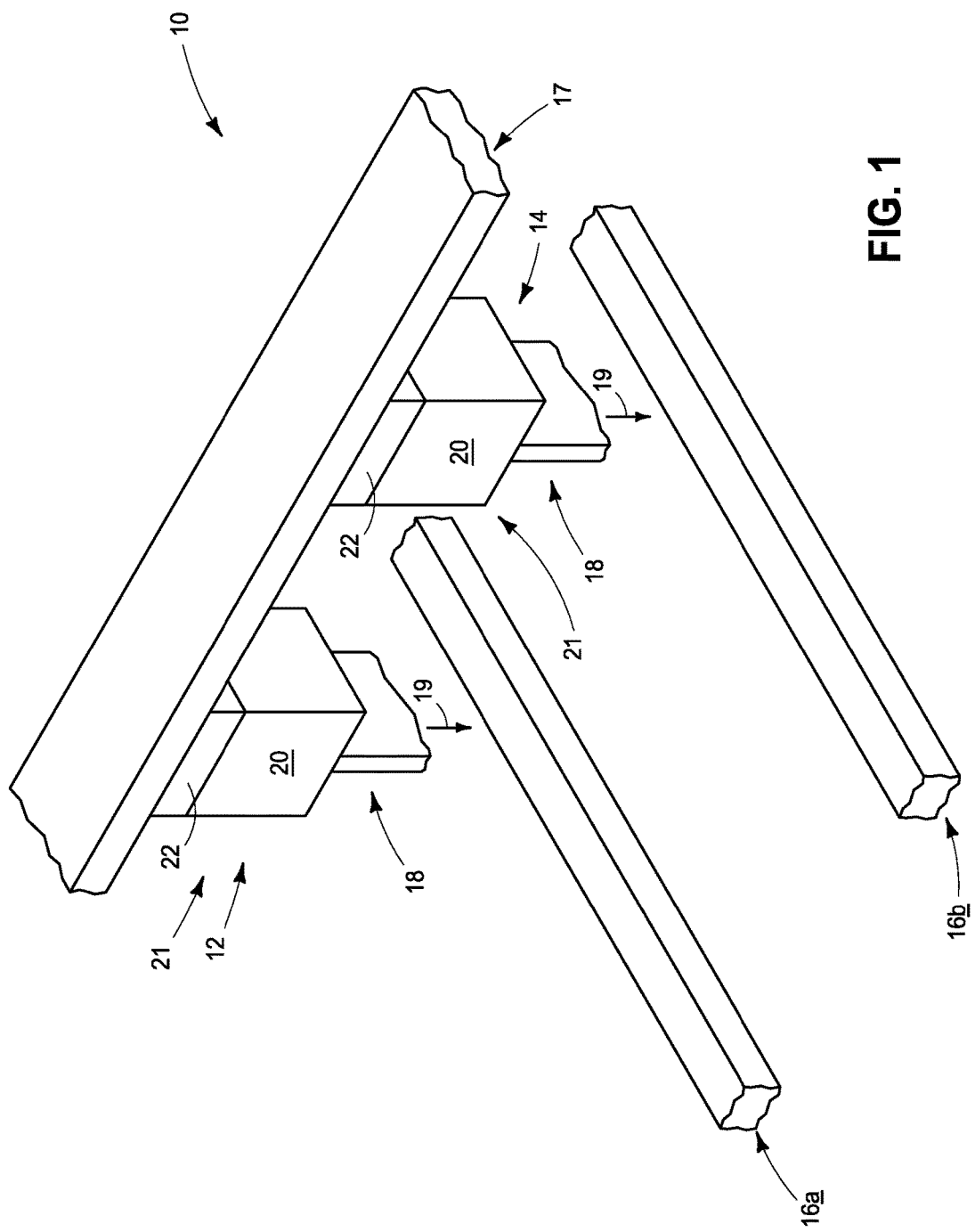
FIG. 1 is a diagrammatic three-dimensional view of an example embodiment arrangement of example embodiment memory cells.

Some embodiments include memory arrays comprising phase change material memory cells, with phase change material of individual memory cells being confined to the memory cells and being isolated from phase change material of adjacent memory cells by one or more insulative materials. FIG. 1 diagrammatically illustrates a fragment of an example embodiment memory array 10, and shows a pair of adjacent memory cells 12 and 14. The cells are arranged between wordlines 16a and 16b, and a bitline 17. The wordlines are parallel to one another and extend along a first direction, and the bitline extends along a second direction substantially orthogonal relative to the direction of the wordlines; with the term "substantially orthogonal" meaning that the directions of the wordlines and bitline are orthogonal to within reasonable tolerances of fabrication and measurement.

The memory cells comprise heater structures 18, phase change material 20, and electrically conductive capping material 22.

The heater structures 18 are electrically coupled to the wordlines 16a and 16b through intervening circuitry (represented by arrows 19). Such intervening circuitry may comprise, for example, select devices (for instance, bipolar junction transistors, field effect transistors, diodes, etc.).

Figure 4:
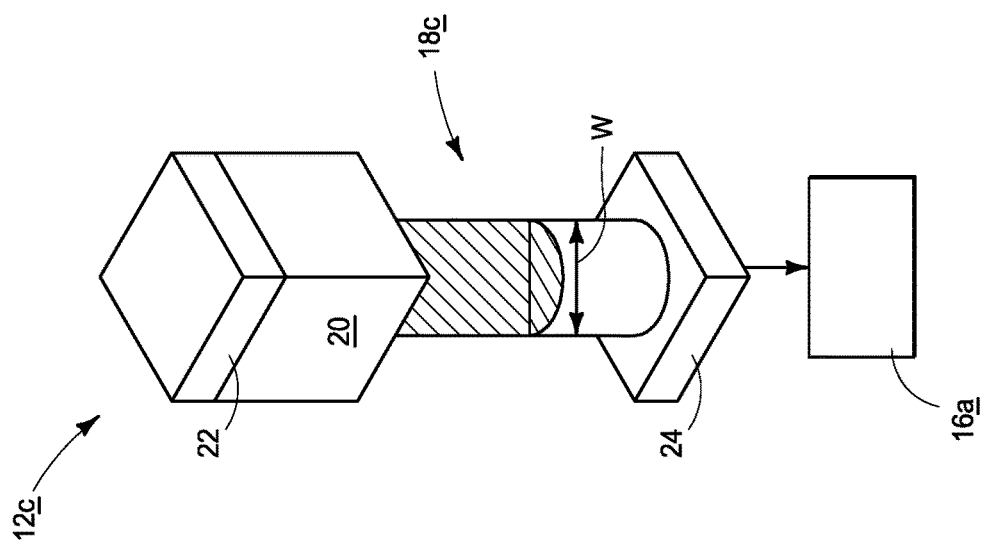
FIGS. 2-4 are diagrammatic three-dimensional views of example embodiment memory cells.
Figure 3:
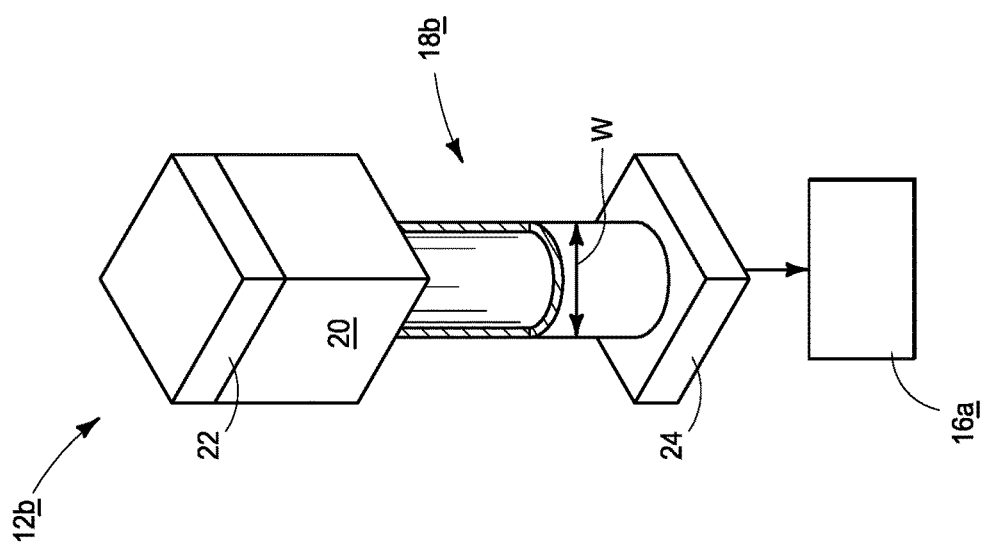
Figure 2:
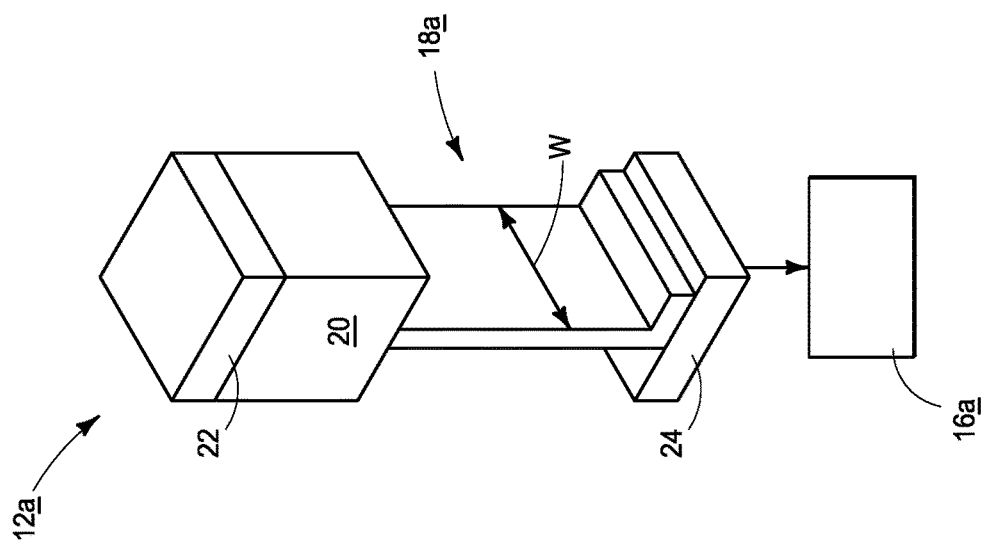

The heater structures 18 may comprise any suitable composition or combination of compositions; and in some embodiments may comprise, consist essentially of, or consist of one or more of WN, TiN, TaN, C, WCN, TiAlN and TiSiN; where the chemical formulas indicate primary components rather than specific stoichiometries. The heater structures may comprise any suitable size and configuration (some example heater structures are illustrated in FIGS. 2-4).

The phase change material 20 is configured as structures 21 confined to individual memory cells, and in the shown embodiment such structures are cubic. The structures may have any suitable shape, including volumes with polygonal sidewalls (for instance, parallelepiped volumes, etc.), volumes with one or more curved sidewalls (for instance, cylindrical volumes, etc.), etc. The structures 21 may be referred to as "confined structures" to indicate that the structures are confined to individual memory cells.

The phase change material 20 may comprise any suitable composition or combination of compositions; and in some embodiments may comprise chalcogenide. Example chalcogenides may include one or more materials selected from the group consisting of germanium, indium, tellurium and antimony. For instance, in some embodiments, example chalcogenides may comprise, consist essentially of, or consist of a mixture of germanium, antimony and tellurium (for instance, $Ge_2Sb_2Te_5$, or any other suitable stoichiometry); which may be referred to as GST.

The phase change material 20 may have any suitable thickness between the heater structure 18 and the capping material 22, and in some embodiments may have a thickness within a range of from about 10 nm to about 50 nm.

The electrically conductive capping material 22 is optional, and in the shown configuration corresponds to top electrodes of the memory cells 12 and 14.

The electrically conductive capping material may comprise any suitable composition or combination of compositions; and in some embodiments may comprise, consist essentially of, or consist of one or more of Ti, TiN, W, C, Ta and TaN; where the chemical formulas indicate primary components rather than specific stoichiometries. In some embodiments, the material 22 of the memory cells may be referred to as a cap over and directly against the phase change material 20.

The phase change material 20 of memory cell 12 is spaced from that of memory cell 14 by one or more insulative materials (not shown), with the term "insulative" being generic for materials which are electrically insulative and/or thermally insulative. Such spacing of the phase change material of adjacent memory cells can alleviate, or even prevent, the problematic thermal disturbance (i.e., crosstalk) which may occur in conventional memory arrays.

The heater structures 18 may comprise any suitable configurations. FIGS. 2-4 show example memory cells 12a-c illustrating a few example heater structure configurations 18a-c. Each memory cell comprises the phase change material 20 and capping material 22 described above, and is shown coupled to a wordline 16a of the type described above. The memory cells 12a-c comprise electrically conductive material 24 beneath the heater structures and directly against such heater structures. Such electrically conductive material may correspond to a bottom electrode of the memory cells, and may comprise any suitable composition or combination of compositions. In some example embodiments, the electrically conductive material 24 may comprise metal silicide and/or conductively-doped silicon.

Heater structure 18a corresponds to an angled plate, and in the shown configuration is "L-shaped" with a horizontal bottom leg of the L-shape being along and directly against conductive material 24, and a vertical leg of the L-shape extending between materials 20 and 24. Heater structure 18b corresponds to a hollow tube, and heater structure 18c corresponds to a solid rod. In some embodiments, the heater structures may have maximum widths "W" of from about 2 nm to about 10 nm.

Example methods of forming example embodiment memory cells and memory arrays are described with reference to FIGS. 5-23. The various materials utilized in such methods may be formed utilizing conventional deposition methodologies, such as, for example, atomic layer deposition (ALD), chemical vapor deposition (CVD), physical vapor deposition (PVD), etc.

Figure 5:
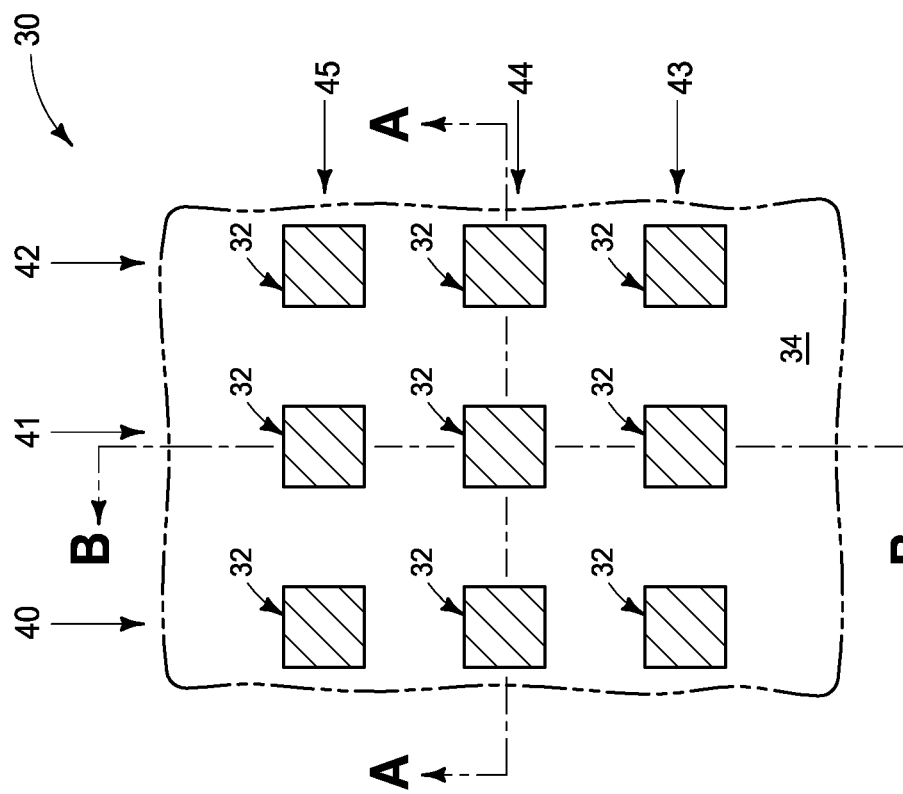
FIG. 5 shows a diagrammatic top view of a fragment of a semiconductor construction at a processing stage of an example embodiment.
Figure 5:
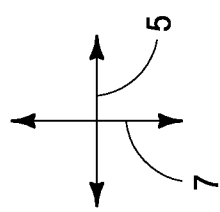

Referring to FIG. 5, a fragment of a semiconductor construction 30 is illustrated in top view. The construction 30 comprises a plurality of electrical nodes 32 which are spaced apart from one another by insulative material 34.

The electrical nodes are arranged in a grid comprising a first direction along an axis 5 and a second direction along an axis 7. In the shown embodiment, the second direction is substantially orthogonal to the first direction.

In some embodiments, the nodes may be considered to be arranged in a two-dimensional array having columns 40-42 along the direction of axis 7 and rows 43-45 along the direction of axis 5. The nodes 32 along common rows as one another may be electrically coupled to one another through wordlines under the rows (with example wordlines 46-48 being shown in the cross-sectional views of FIG. 6).

Although the nodes 32 are shown to be square, in other embodiments the nodes may have other shapes; such as, for example, polygonal shapes, round shapes, elliptical shapes, rounded corner shapes, etc.

The insulative material 34 may comprise any suitable composition or combination of compositions, and in some embodiments may comprise one or more of silicon nitride, silicon dioxide, borophosphosilicate glass (BPSG), phosphosilicate glass (PSG), etc.

The nodes 32 may correspond to first electrodes (or bottom electrodes) of memory cells in some embodiments (with example memory cells being shown in FIGS. 13, 16, 18 and 23). The nodes 32 may comprise any suitable composition or combination of compositions; and in some embodiments may comprise conductively-doped silicon, metal silicide (for instance, titanium silicide) and/or other metals, metal alloys, metal compositions, etc. (for instance, W, TiN, Ti, etc.). In some embodiments, the nodes 32 may be upper regions of conductive pedestals, and such conductive pedestals may include select devices between the nodes and underlying wordlines. The select devices may be any suitable devices, including, for example, bipolar junction transistors, field effect transistors, diodes, etc. For instance, in some embodiments the nodes may correspond to upper surfaces of pedestals analogous to those shown and described in U.S. patent publication 2010/0308296 (with inventors Pirovano, Servalli, Pellizzer and Redaelli).

The nodes 32 and material 34 may be supported by an underlying semiconductor material, and in such embodiments construction 30 may be considered to be a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. Construction 30 may correspond to a semiconductor substrate containing one or more materials associated with integrated circuit fabrication. Some of the materials may be under the shown fragment of construction 30 and/or may be laterally adjacent the shown fragment; and may correspond to, for example, one or more of refractory metal materials, barrier materials, diffusion materials, insulator materials, etc.

Figure 6:
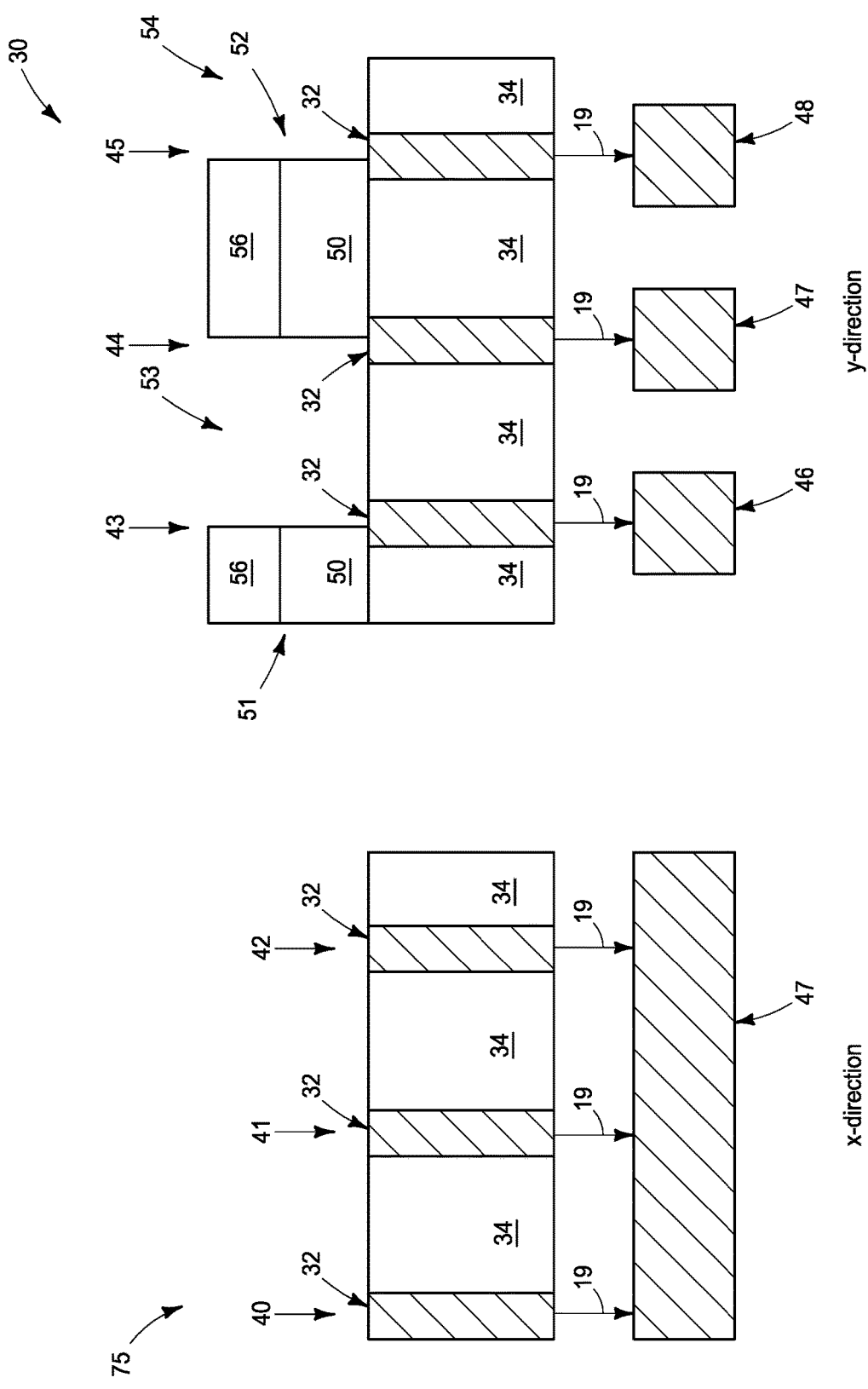
FIG. 6 shows cross-sectional illustrations along an x-direction (parallel to a wordline direction) and a y-direction (parallel to a bitline direction) of a semiconductor construction at a processing stage subsequent to that of FIG. 5. The x-direction may be considered to be along the line A-A of FIG. 5, and the y-direction may be considered to be along the line B-B of FIG. 5.

FIG. 6 shows cross-sectional views of construction 30 at a processing stage subsequent to that of FIG. 5. One of the views of FIG. 6 is along an x-direction (i.e., along an x-axis), and the other is along a y-direction (i.e., along a y-axis). In some embodiments, the view along the x-direction may be along one of the rows 43-45 of the array of FIG. 5, and for instance may be along the line A-A; and the view along the y-direction may be along one of the columns 40-42 of the array of FIG. 5, and for instance may be along the line B-B.

The nodes 32 are shown to be top regions of electrically conductive pedestals. Although the pedestals are shown to be homogeneous, it is to be understood that the pedestals may comprise multiple discrete electrically conductive compositions. For instance, the pedestals may comprise multiple different doped regions of semiconductor material consistent with formation of diodes, bipolar junction transistors, etc., as select devices within the pedestals.

Wordlines 46-48 are shown to be under the nodes 32, and to be electrically-connected to the nodes (as diagrammatically illustrated with arrows 19). The wordlines extend along a same direction as the rows 43-45 of FIG. 5 (i.e., extend along the first direction of axis 5 of FIG. 5). Accordingly, the wordlines 46-48 extend in and out of the page relative to the y-direction of FIG. 6, and the wordline 47 extends along the x-direction of FIG. 6.

Insulative material 50 may be formed over the array of electrical nodes. Such material may extend along the rows 43-45 of FIG. 5 (i.e., extend along the first direction of axis 5 of FIG. 5), and accordingly extend in and out of the page relative to the y-direction of FIG. 6. Such insulative material may be configured as one or more lines, and two representative lines 51 and 52 are shown in FIG. 6. The lines of electrically insulative 50 are spaced apart from one another by intervening gaps (with two representative gaps 53 and 54 being illustrated in FIG. 6). The lines 51 and 52, together with the gaps 53 and 54, form an undulating topography across the top of construction 30. The lines 51 and 52 may be patterned utilizing any suitable mask (not shown); including, for example, a photolithographically-patterned photoresist mask and/or a sublithographic mask formed utilizing pitch multiplication methodologies.

The lines 51 and 52 may be of any suitable height, and are over the paired rows of the array of nodes 32. For instance, line 52 can be seen to extend across two different nodes 32 in the y-direction cross-section of FIG. 6, with such nodes being from rows 44 and 45. The line 52 continues to extend across nodes from both of rows 44 and 45 in directions in and out of the page relative to the y-direction view of FIG. 6. In some embodiments, the lines of material 50 may be patterned utilizing a mask having a pitch which is about twice as large as a pitch of a mask utilized to pattern the nodes 32 within the array shown in FIG. 5.

The insulative material 50 may comprise any suitable composition or combination of compositions. In some embodiments, it may be desired that material 50 comprise a non-oxygen-containing material, such as silicon nitride, in that material 50 may ultimately directly contact oxidation-sensitive phase change material (for instance, some chalcogenides) and it can be desired to avoid oxidation of such phase change material in some embodiments. In other embodiments, the phase change material may be resistant to oxidative damage by at least some oxygen-containing insulative materials, and in such embodiments the material 50 may be an oxygen-containing material; such as, for example, aluminum oxide, silicon oxynitride, etc.

In the shown embodiment, a second material 56 is over material 50, and is also patterned into the lines 51 and 52. The second material 52 may be of a composition different from material 50, and may be utilized as a selectively removable material during a subsequent polishing step (described below with reference to FIG. 8). In some embodiments, material 52 may comprise, consist essentially of, or consist of silicon dioxide.

Figure 7:
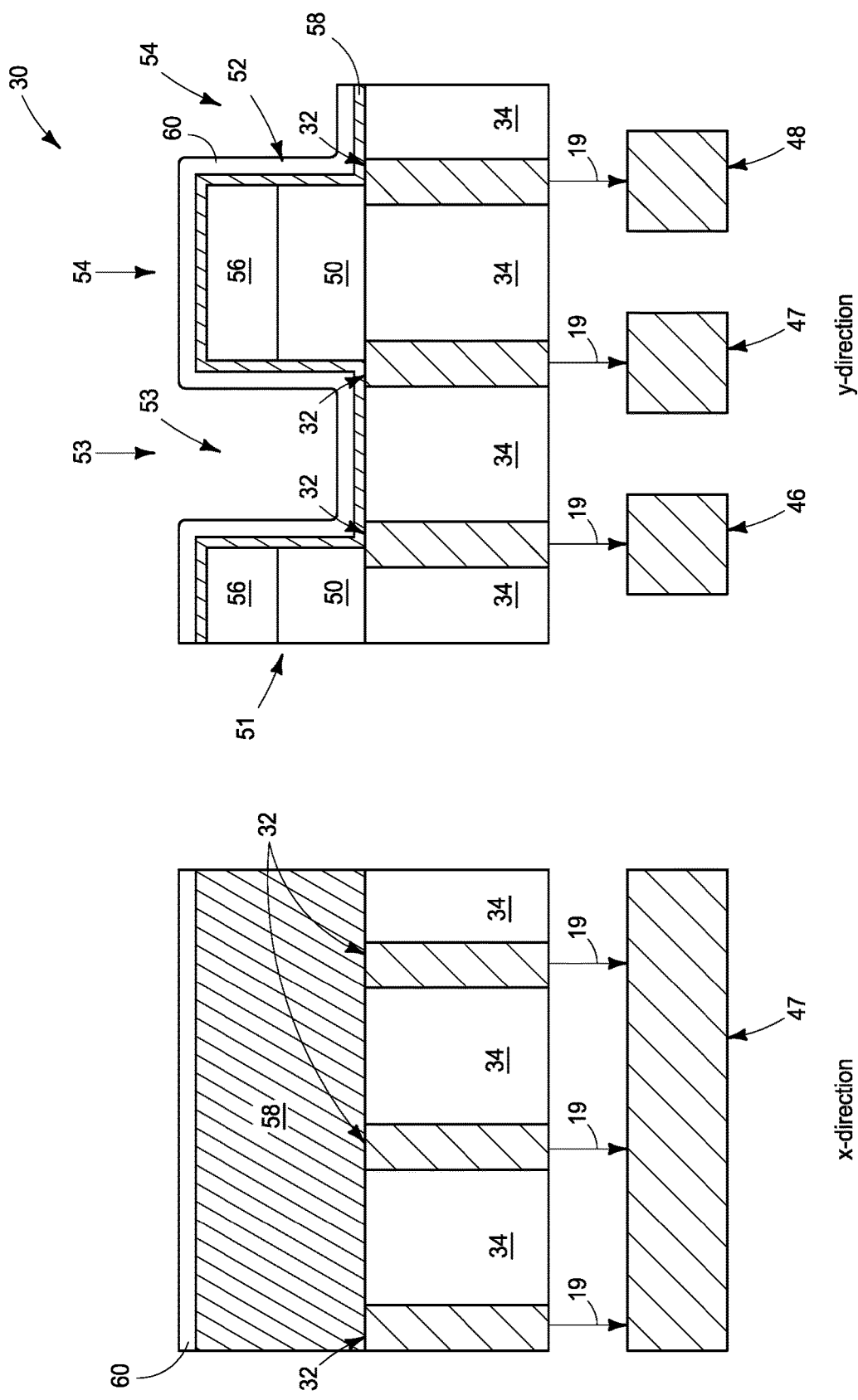
FIGS. 7-11 and 13 show cross-sectional illustrations of the construction of FIG. 6 at processing stages subsequent to that of FIG. 6 in accordance with an example embodiment.

Referring to FIG. 7, an expanse of heater material 58 is formed over and between the lines of material 50 (i.e., is formed across the undulating topography defined by the lines of material 50 and the gaps between such lines). The heater material may comprise any suitable composition or combination of compositions; and in some embodiments may comprise one or more of WN, TiN, TaN, C, WCN, TiAlN and TiSiN; where the chemical formulas indicate primary components rather than specific stoichiometries.

Insulative material 60 is formed across the heater material 58, and in the shown embodiment is directly against such heater material. In some embodiments, it can be desired that material 60 be a non-oxygen-containing material, such as silicon nitride, in that the material 60 may ultimately be directly against chalcogenide.

Figure 8:
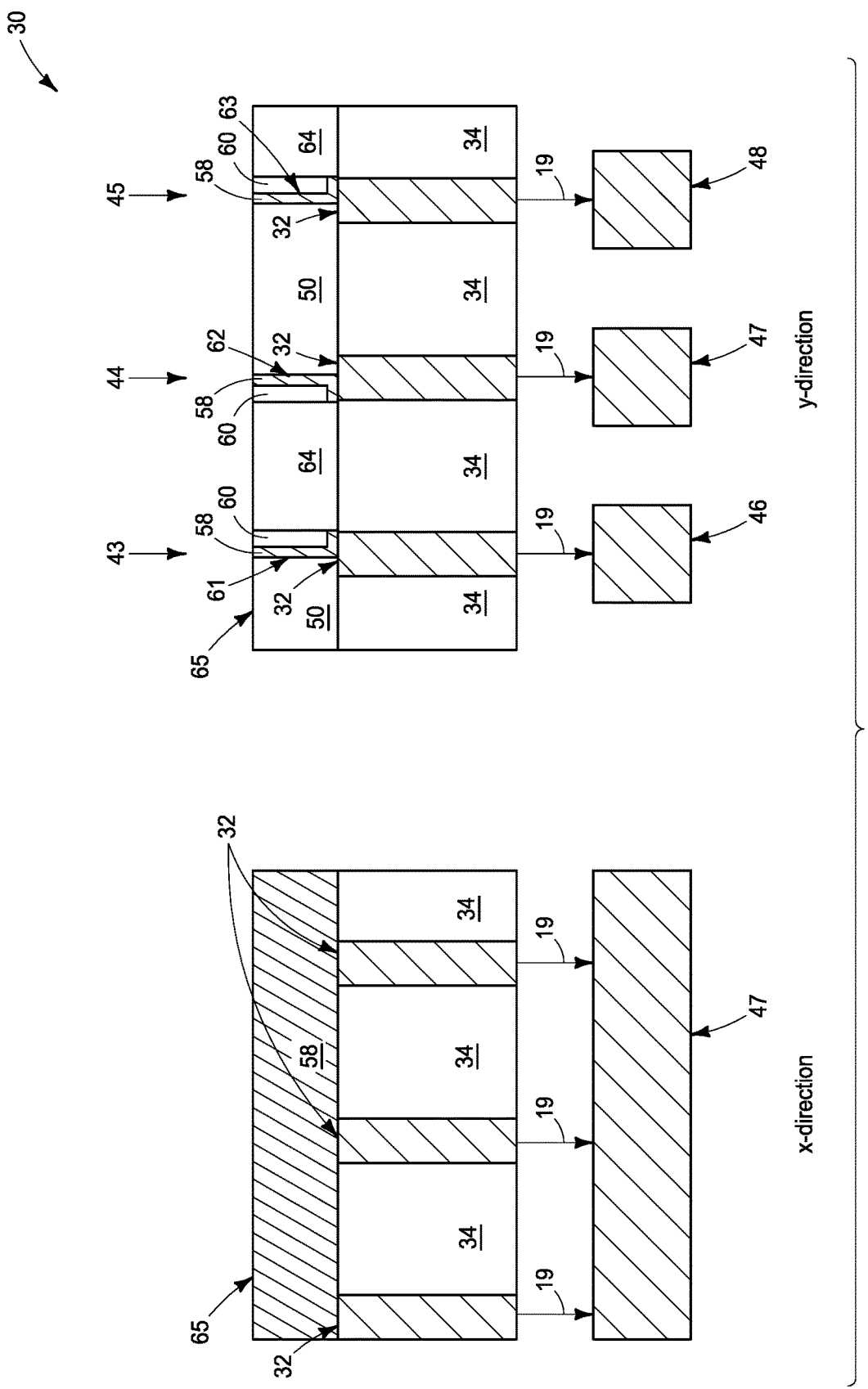

Referring to FIG. 8, chemical-mechanical polishing (CMP) or other suitable planarization is utilized to remove materials 58 and 60 from over material 50. In some embodiments, the material 56 (FIG. 7) may be utilized as a selectively removable material during the polishing. For instance, if material 56 comprises silicon dioxide and material 50 comprises silicon nitride, the polishing may be conducted until silicon dioxide is substantially entirely removed, or in other words may be conducted utilizing material 50 as an etchstop.

FIG. 8 also shows that patterning has been conducted to remove heater material 58 and insulative material 60 from within the gaps 53 and 54 (FIG. 7). The heater material 58 remaining at the process stage of FIG. 8 is configured as lines 61-63 which extend along rows 43-45 of FIG. 5 (i.e., which extend along a direction of the axis 5 of FIG. 5). In the shown embodiment, the lines 61-63 are angled plates; with such plates being "L-shaped" along the y-direction cross-section.

Insulative material 64 is formed between the heater material lines 61-63. The insulative material 64 may comprise any suitable composition or combination of compositions, and in some embodiments may comprise one or both of silicon nitride and silicon dioxide.

The planarization across an upper surface of construction 30, removal of heater material from within gaps 53 and 54 (FIG. 7), and formation of insulative material 64 may be conducted in any suitable sequence. In the shown embodiment, insulative material 64 is formed before the planarization, and accordingly a planarized surface 65 extends across all of the materials 50, 58, 60 and 64.

Figure 9:
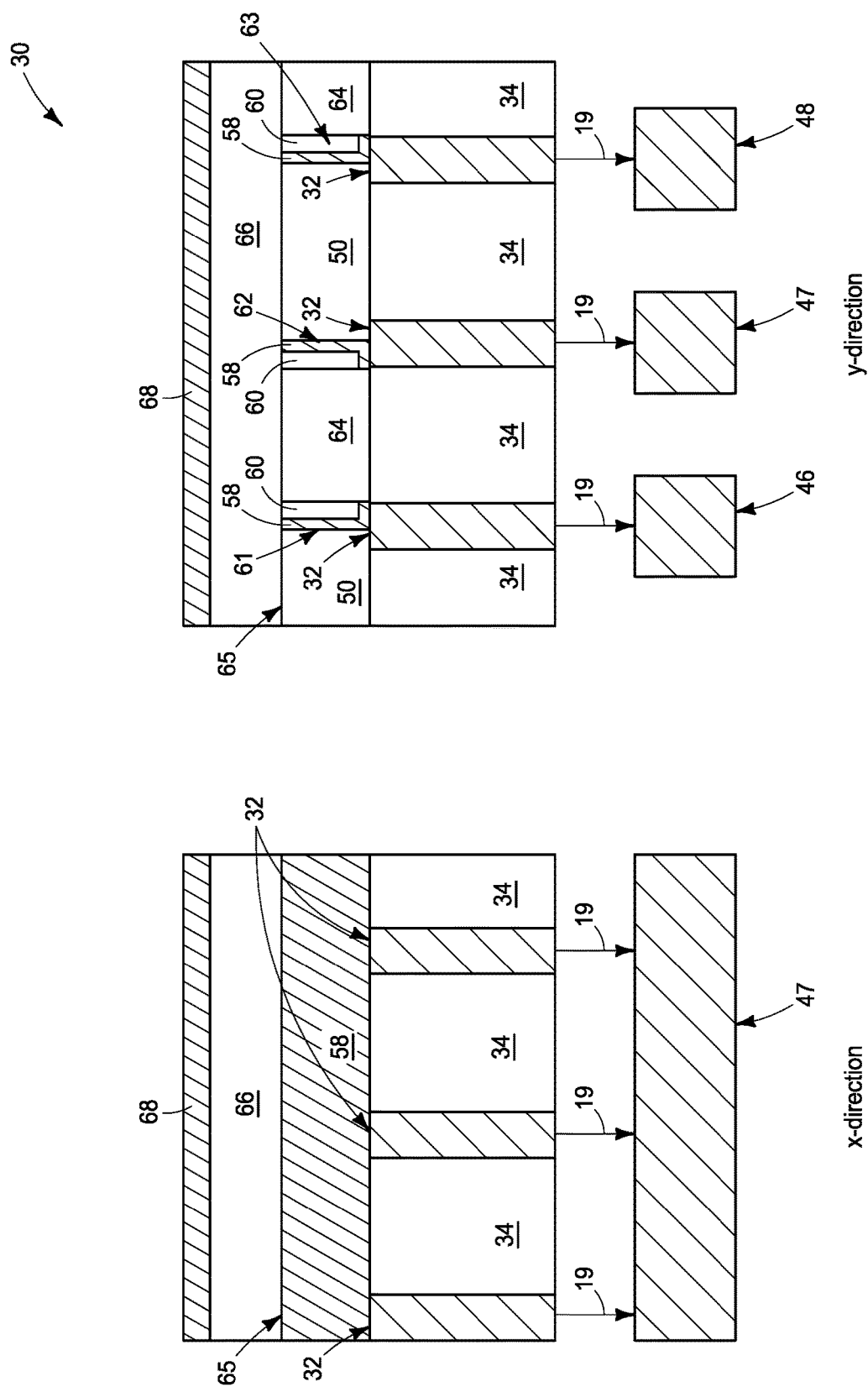

Referring to FIG. 9, phase change material 66 is formed on planarized surface 65, and accordingly is formed across the lines 61-63 of heater material 58. The phase change material may comprise any suitable composition or combination of compositions, and in some embodiments may comprise chalcogenide. In specific embodiments, the phase change material may comprise one or more materials selected from the group consisting of germanium, indium, tellurium and antimony. For instance, the phase change material may comprise, consist essentially of, or consist of a mixture of germanium, antimony and tellurium (for instance, $Ge_2Sb_2Te_5$, or any other suitable stoichiometry).

A cap of electrically conductive material 68 is formed over and directly against the phase change material in the shown embodiment. The electrically conductive capping material 68 may comprise any suitable composition or combination of compositions. In some embodiments, the capping material may comprise, consist essentially of, or consist of one or more of Ti, TiN, W, C, Ta and TaN, where the chemical formulas indicate primary components rather than specific stoichiometries.

Figure 10:
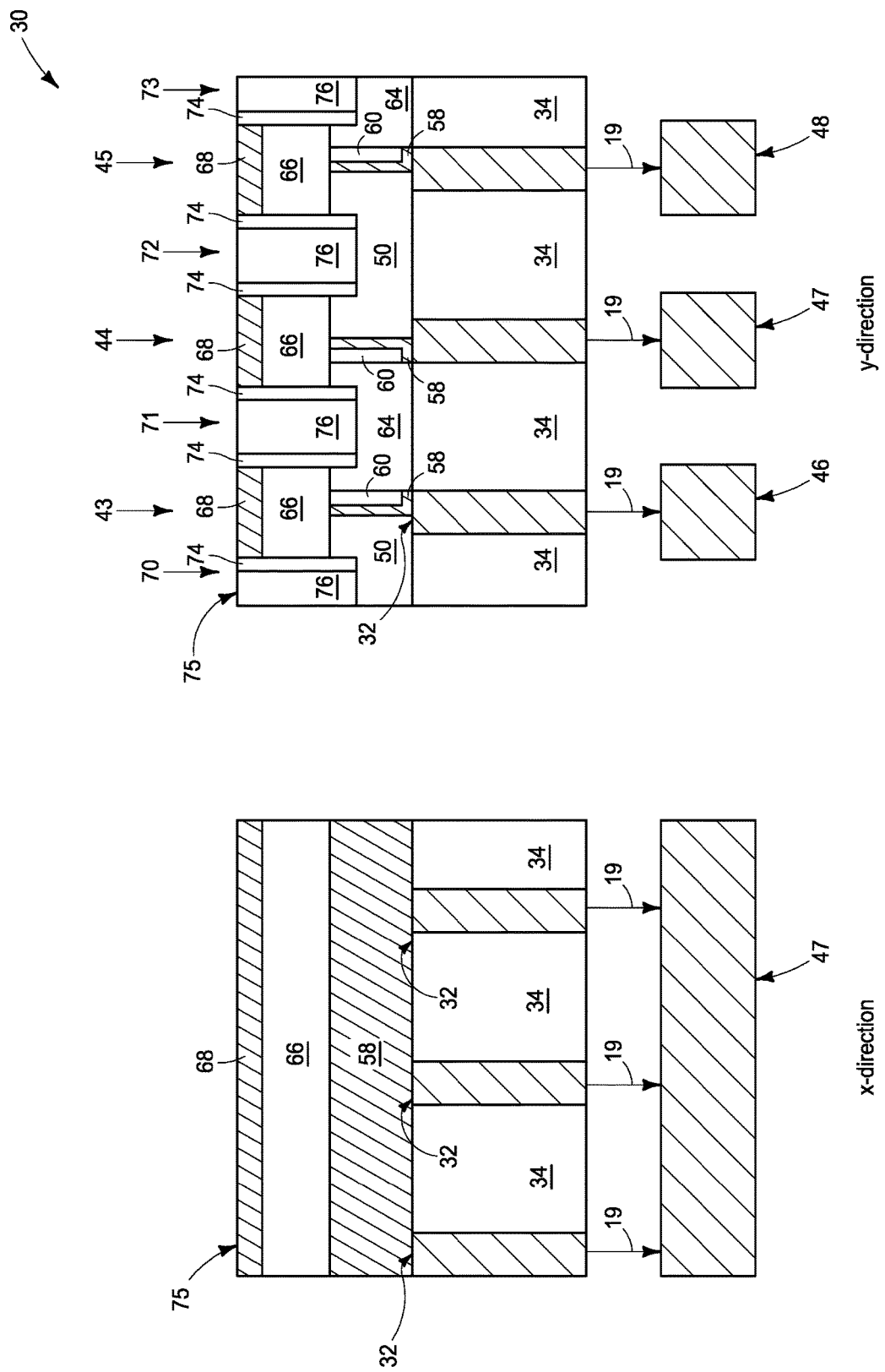

Referring to FIG. 10, trenches 70-73 are formed to extend through the phase change material 66 and the capping material 68. The trenches may also extend partially or totally through the insulative materials 50 and 64 (and extend partially through such insulative materials in the shown embodiment). The trenches are formed to extend along the same direction as rows 43-45 of FIG. 5 (i.e., to extend along the direction of axis 5 of FIG. 5), and accordingly extend in and out of the page relative to the y-direction cross-section of FIG. 10 (i.e., extend across the y-direction cross-section). The trenches 70-73 may be patterned utilizing any suitable mask (not shown); including, for example, a photolithographically-patterned photoresist mask and/or a mask formed utilizing pitch multiplication methodologies.

Sidewall edges of the trenches are lined with insulative material 74, and then the remainder of the trenches is filled with insulative material 76. The material 74 may be a non-oxygen-containing material, such as silicon nitride, since such material directly contacts the phase change material 66 and it can be desired to avoid oxidative damage of chalcogenide-containing phase change materials in some embodiments. In other embodiments, the phase change material 66 may be resistant to oxidative damage by at least some oxygen-containing insulative materials, and in such embodiments the material 74 may be an oxygen-containing material; such as, for example, aluminum oxide, silicon oxynitride, etc.

The insulative material 76 may comprise any suitable composition or combination of compositions, and in some embodiments may comprise silicon dioxide and/or other oxygen-containing insulative material.

The filling of the trenches with insulative material may be accomplished with a single deposition, or with a sequence of depositions and etch-backs. Although the trenches are shown entirely filled with various insulative materials, in some embodiments air gaps may be left within the trenches (for instance, air gaps may be utilized instead of the material 76 between the liners of material 74, or air gaps may remain under the material 76). Although the trenches are shown filled with two different insulative materials, in other embodiments the trenches may be filled with only a single insulative material, and in yet other embodiments the trenches may be filled with more than two insulative materials.

After the trenches are filled with the desired insulative materials (for instance, materials 74 and 76 in the shown embodiment), planarization (for instance, CMP) may be conducted to form the shown planarized surface 75 extending across the materials 68, 74 and 76.

Figure 11:
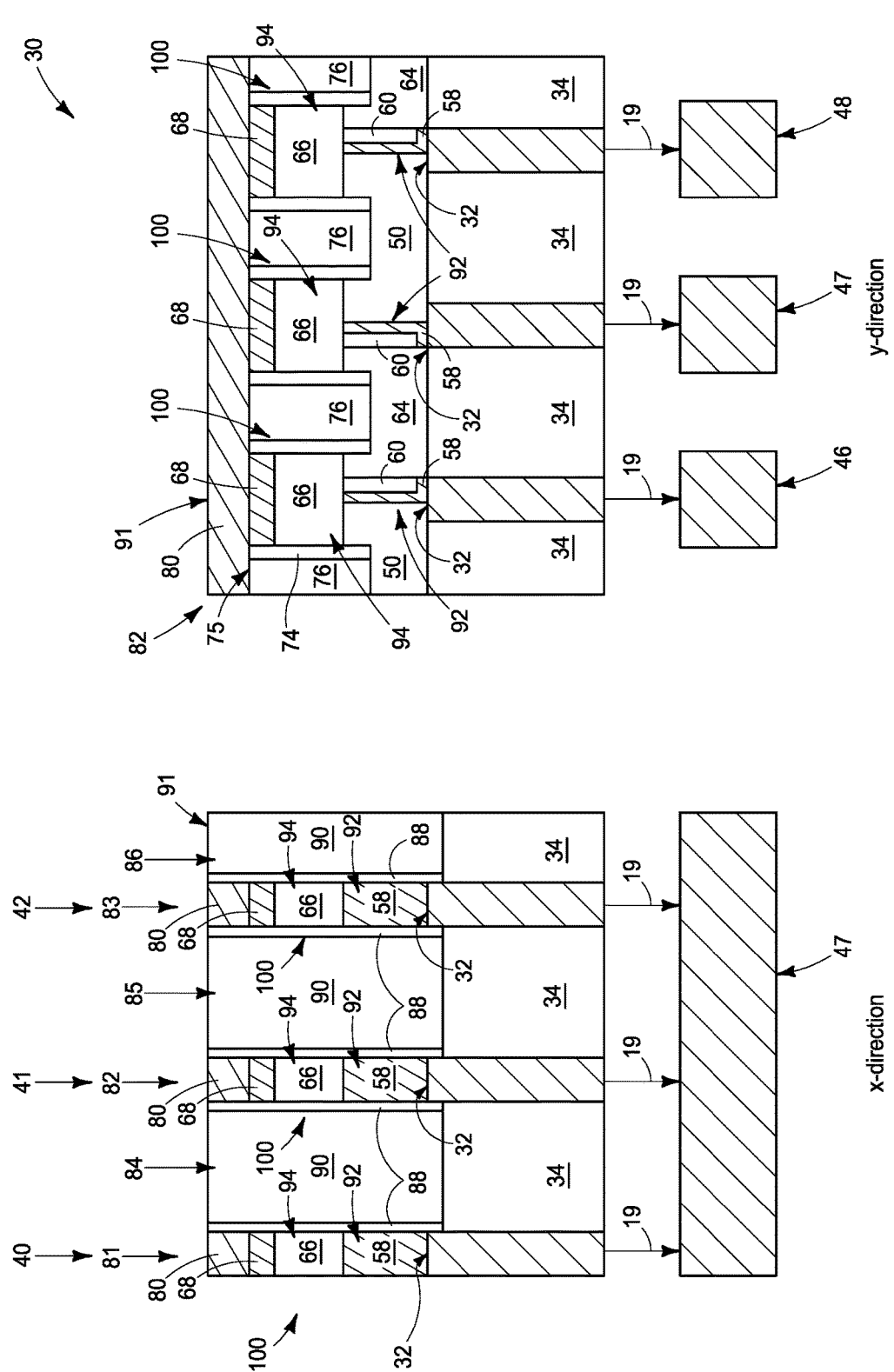

Referring to FIG. 11, bitline material 80 is formed across planarized surface 75 and patterned into bitlines 81-83. The bitlines are formed to be lines extending along the same direction as columns 40-42 of FIG. 5 (i.e., extending along the direction of axis 7 of FIG. 5), and accordingly the bitlines extend in and out of the page relative to the x-direction cross-section of FIG. 11 (i.e., extend across the x-direction cross-section).

The bitline material 80 may comprise any suitable composition or combination of compositions, and in some embodiments may comprise metal. For instance, the bitline material may comprise, consist essentially of, or consist of one or more of tungsten, titanium nitride, tantalum nitride, tungsten nitride, etc. The bitline material may be deposited utilizing any suitable methodology, including, for example, one or more of PVD, ALD, CVD, etc.

The bitline material may be patterned into bitlines 81-83 utilizing any suitable methodology. For instance, a photolithographically-patterned photoresist mask (not shown) may be formed over the bitline material, a pattern transferred from the mask into the bitline material, and then the mask removed to leave the patterned lines. Alternatively, or additionally, the mask may be formed to be sublithographic by utilizing appropriate methodologies; such as, for example, pitch-multiplication methodologies.

Trenches 84-86 are formed to extend through the heater material 58, the phase change material 66 and the capping material 68. In the shown embodiment, the trenches also extend partially into the insulative material 34. The trenches are formed to extend along the same direction as columns 40-42 of FIG. 5 (i.e., to extend along the direction of axis 7 of FIG. 5), and accordingly extend in and out of the page relative to the x-direction cross-section of FIG. 11 (i.e., extend across the x-direction cross-section). In some embodiments, the bitlines 81-83 may be utilized as a hardmask during formation of trenches 84-86. In other embodiments, the trenches may be formed prior to formation of the bitlines.

In some embodiments, the trenches 70-73 formed at the processing stage of FIG. 10 may be referred to as first trenches, and the trenches 84-86 formed at the processing stage of FIG. 11 may be referred to as second trenches.

Sidewall edges of the trenches 84-86 may be lined with insulative material 88, and then the remainder of the trenches can be filled with insulative material 90. The material 88 may be a non-oxygen-containing material, such as silicon nitride, since such material directly contacts the phase change material 66. In other embodiments, the material 88 may be an oxygen-containing material; such as, for example, aluminum oxide, silicon oxynitride, etc.

The insulative material 90 may comprise any suitable composition or combination of compositions, and in some embodiments may comprise silicon dioxide and/or other oxygen-containing insulative material.

The filling of the trenches with insulative material may be accomplished with a single deposition, or with a sequence of depositions and etch-backs. Although the trenches are shown entirely filled with various insulative materials, in some embodiments air gaps may be left within the trenches (for instance, air gaps may be utilized instead of the material 90 between the liners of material 88, or air gaps may remain under the material 90). Although the trenches are shown filled with two different insulative materials, in other embodiments the trenches may be filled with only a single insulative material, and in yet other embodiments the trenches may be filled with more than two insulative materials.

In some embodiments, the insulative material 74 utilized to line the first trenches 70-73 (FIG. 10) may be referred to as a first insulative material, and the insulative material 88 utilized to line the second trenches 84-86 may be referred to as a second insulative material. In some embodiments, the first and second insulative materials may comprise a same composition as one another; and may, for example, both comprise, consist essentially of, or consist of silicon nitride. In other embodiments, such first and second insulative materials 74 and 88 may comprise different compositions relative to one another. In some embodiments, air gaps may be utilized as insulative materials in both the first trenches 70-73 (FIG. 10) and the second trenches 84-86, and such air gaps may thus entirely surround structures patterned from the first and second trenches (such as memory cells that are described below).

After the trenches 84-86 are filled with the desired insulative materials (for instance, materials 88 and 90 in the shown embodiment), planarization (for instance, CMP) may be conducted to form the shown planarized surface 91 extending across the materials 80, 88 and 90.

The first and second trenches 70-73 (FIG. 10) and 84-86 (FIG. 11) pattern the lines of heater material 58 (an example line is shown along the x-direction of FIG. 10) into heater structures 92 which are in one-to-one correspondence with nodes 32, pattern the phase change material 66 into confined structures 94 which are also in one-to-one correspondence with nodes 32, and pattern the capping material 68 into blocks which are in one-to-one correspondence with the confined structures 94 of phase change material 66. Each confined structure of the phase change material is within an individual memory cell 100, and such memory cells form a memory array. Each memory cell may be uniquely addressed through the combination of a wordline (for instance, one of the wordlines 46-48) and a bitline (for instance, one of the bitlines 81-83).

Each confined structure 94 of phase change material 66 is entirely laterally surrounded by insulative material (specifically, the insulative materials 74 and 88 in the shown embodiment). Accordingly, the phase change material within each memory cell 100 is isolated from phase change material of adjacent memory cells. In the shown embodiment, the phase change material of each memory cell is spaced from the phase change material of adjacent memory cells by insulative materials 74, 76, 88 and 90; and in some embodiments the phase change materials of adjacent memory cells may be more generically indicated to be spaced from one another by one or more insulative materials.

In the shown embodiment, the phase change material 66 is confined within individual memory cells rather than spreading beyond the memory cells. Such confinement of the phase change material can reduce, or even eliminate, thermal disturb (crosstalk) between adjacent memory cells. Also, the utilization of confined structures of phase change material within memory cells may advantageously reduce programming current of the memory cells as compared to conventional configurations of phase change material across memory arrays.

In embodiments in which the insulative materials 74 and 88 comprise a common composition (for instance, silicon nitride), such composition entirely surrounds and contacts a lateral periphery of the phase change material within the memory cells 100. Such can be advantageous in some applications. For instance, if it is desired that the phase change material contact non-oxygen-containing insulative material, it can be advantageous that the insulative material entirely laterally surrounding the memory cells be silicon nitride.

In some embodiments, the construction of FIG. 11 may be considered to comprise confined phase change material structures 94 which are spaced from one another along the illustrated y-direction by insulative regions comprising oxide-containing material 76 sandwich between nitride-containing material 74; and which are spaced from one another along the illustrated x-direction by insulative regions comprising oxide-containing material 90 sandwich between nitride-containing material 88. In the shown embodiment, the insulative regions along the x-direction which comprise materials 88 and 90 are deeper than the insulative regions along the y-direction which comprise materials 74 and 76. Specifically, the insulative regions comprising materials 88 and 90 along the x-direction cut entirely through heater material 58, and those along the y-direction comprising materials 74 and 76 do not extend entirely through the heater material.

In some embodiments, the formation of a construction of the type shown in FIG. 11 may include provision of tungsten-containing bitline structures in a self-aligned fabrication sequence relative to the memory cells prior to formation of copper-containing bitline structures. This may simplify formation of the copper-containing bitline structures by, for example, utilizing the tungsten-containing structures as stopping structures to avoid over etching relative to the underlying memory cells.

Figure 12:
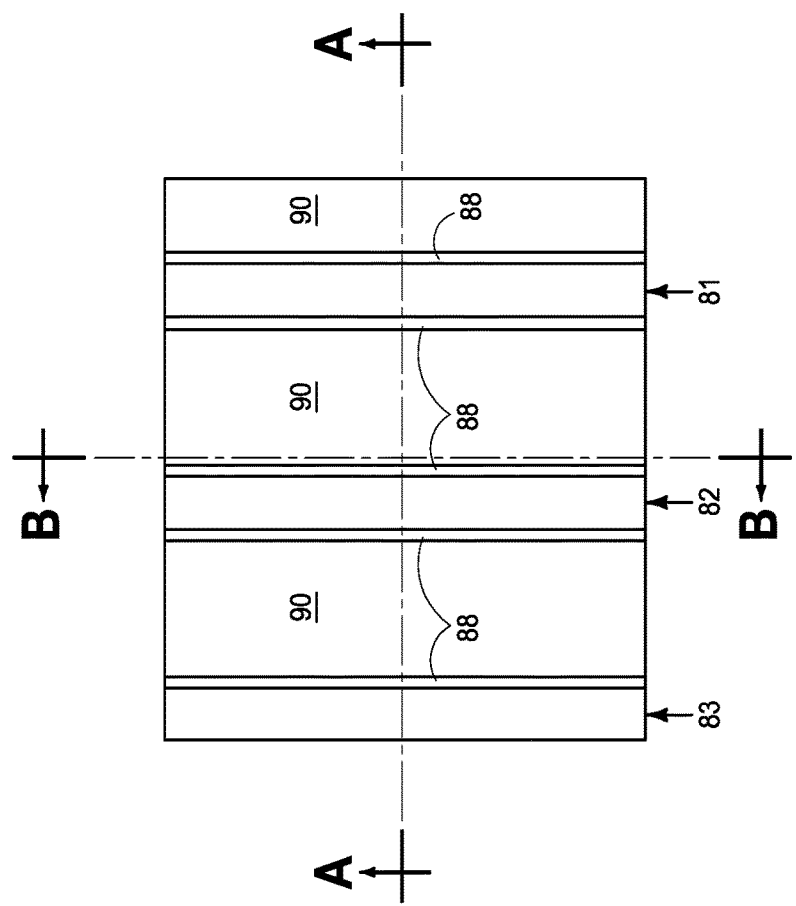
FIG. 12 shows a diagrammatic top view of the construction of FIG. 11.
Figure 12:
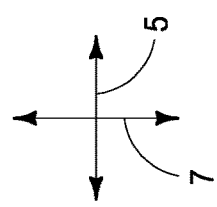

FIG. 12 is a top view of the construction of FIG. 11, and shows the bitlines 81-83 extending along the direction of axis 7.

Figure 13:
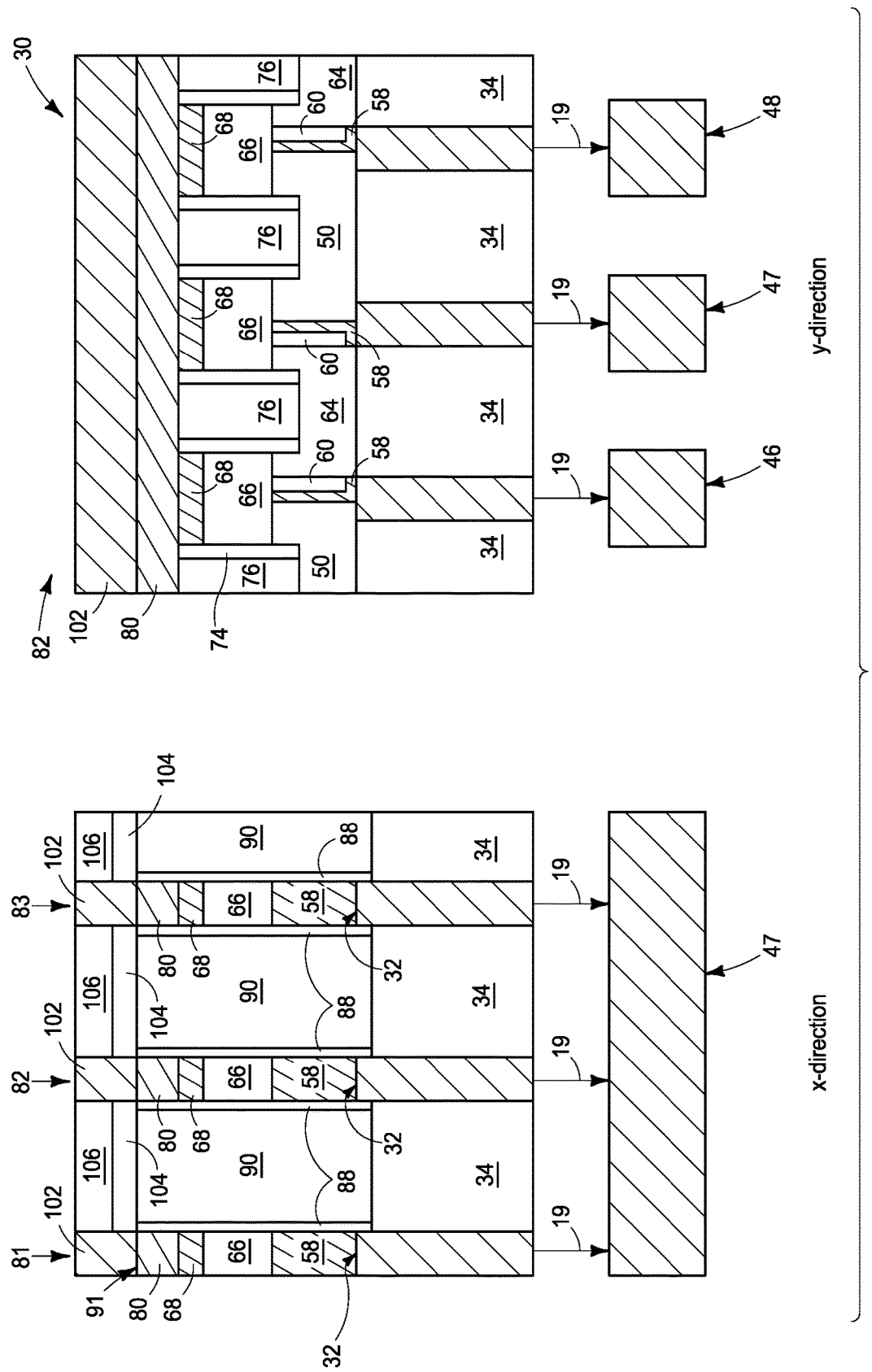

Referring to FIG. 13, optional processing may be utilized to form additional conductive material over the bitline material 80 to reduce electrical resistance along the bitlines, if so desired. In the shown embodiment, electrically conductive material 102 is formed across bitline material 80, and patterned into lines directly over and along material 80. In some embodiments, conductive material 102 may comprise metallic material, and may, for example, comprise one or both of copper and tungsten. The material 102 may be patterned utilizing any suitable processing. For instance, the material may be patterned utilizing a damascene process. In the example embodiment, insulative materials 104 and 106 are formed over planarized surface 91, and then trenches are formed within such insulative materials and filled with conductive material 102. Subsequent planarization may be utilized to remove excess material 102, and form the shown lines of material 102. The insulative materials 104 and 106 may comprise any suitable compositions, and in some embodiments the insulative material 104 may comprise silicon nitride and the insulative material 106 may comprise silicon dioxide.

Figure 15:
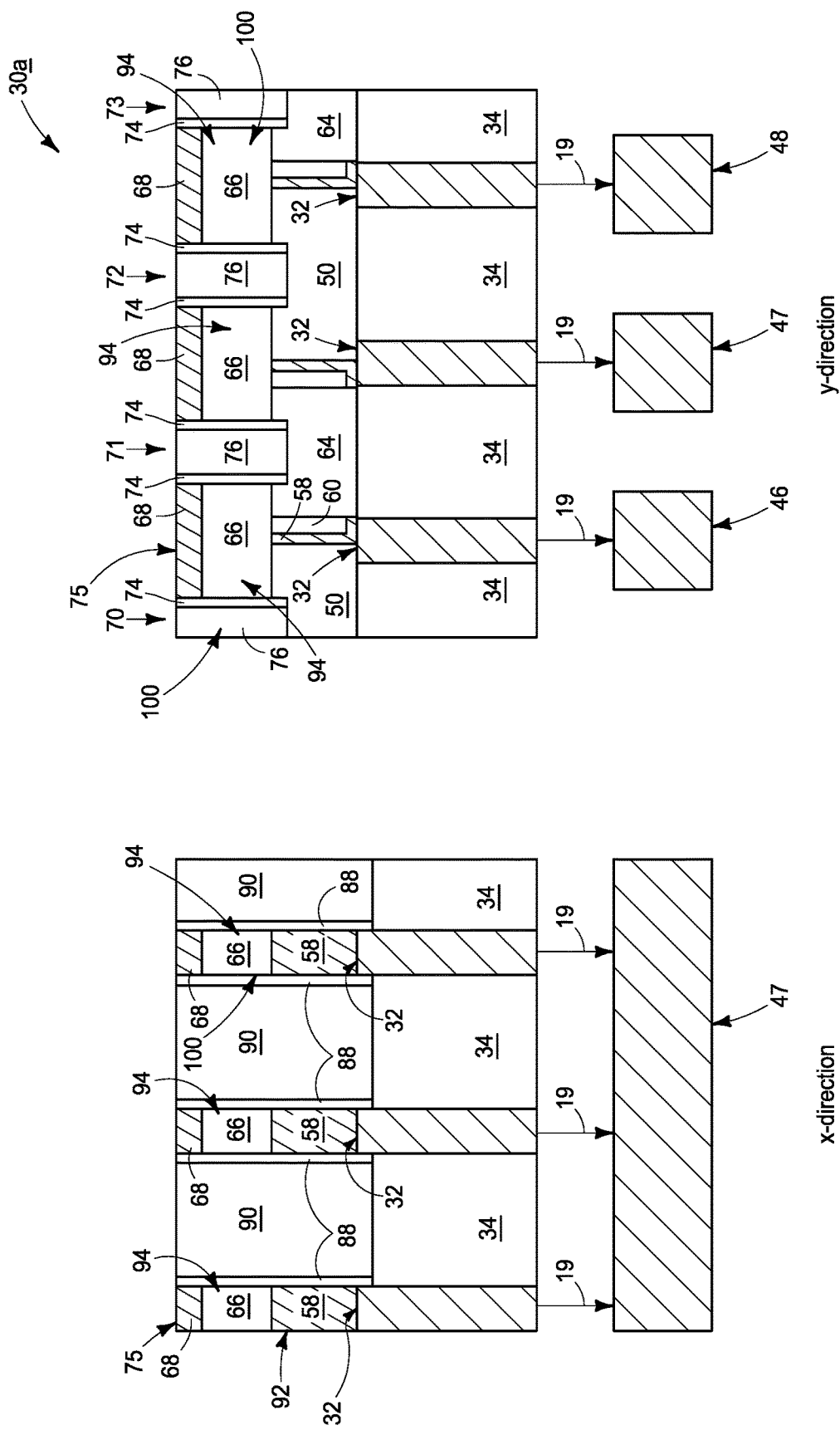
Figure 16:
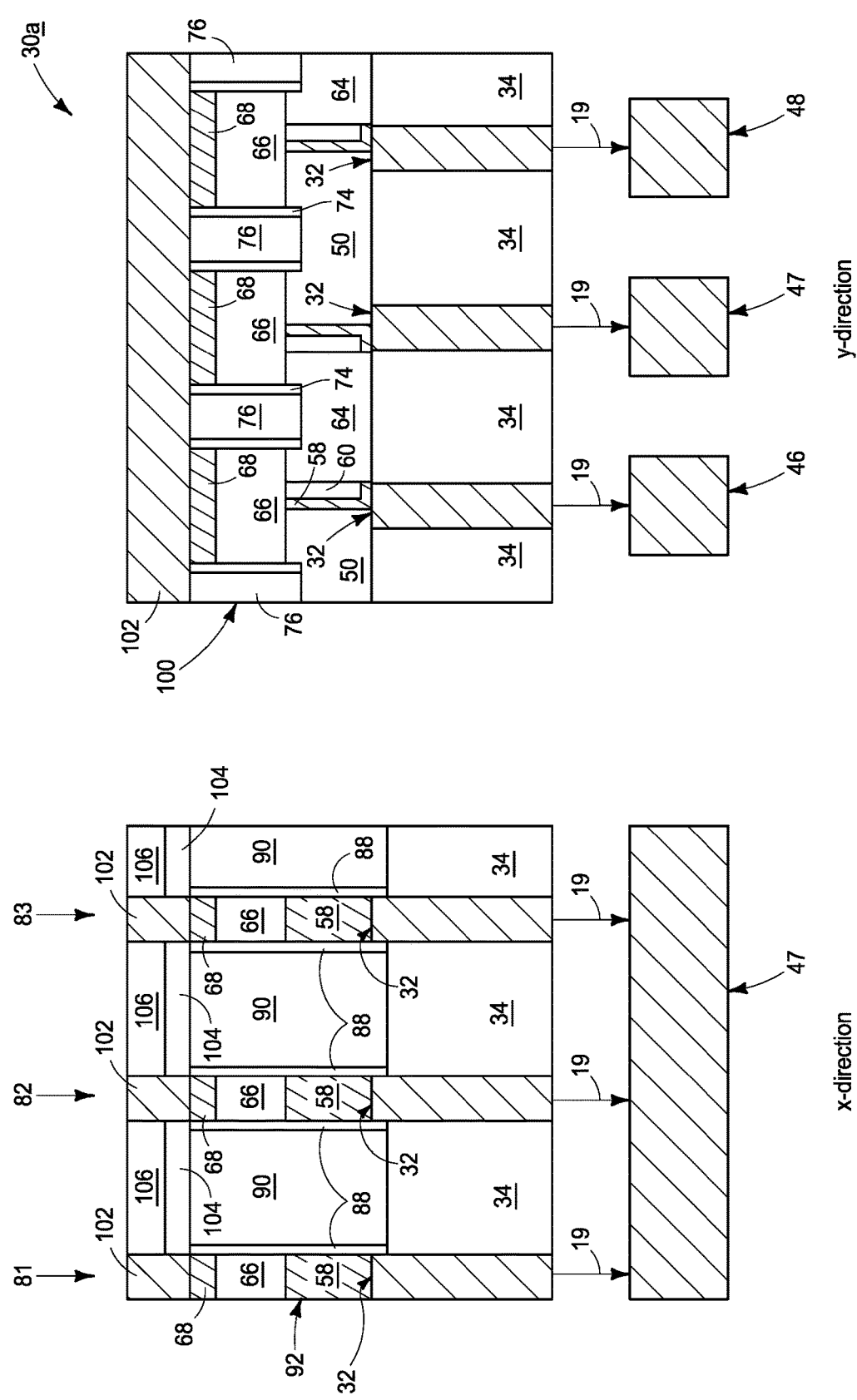

The embodiment of FIGS. 10-13 formed trenches across the y-direction prior to forming the trenches across the x-direction. In other embodiments, the trenches may be formed in reverse order. For instance, FIGS. 14-16 illustrate an example embodiment in which the trenches are formed across the x-direction prior to forming the trenches across the y-direction.

Figure 14:
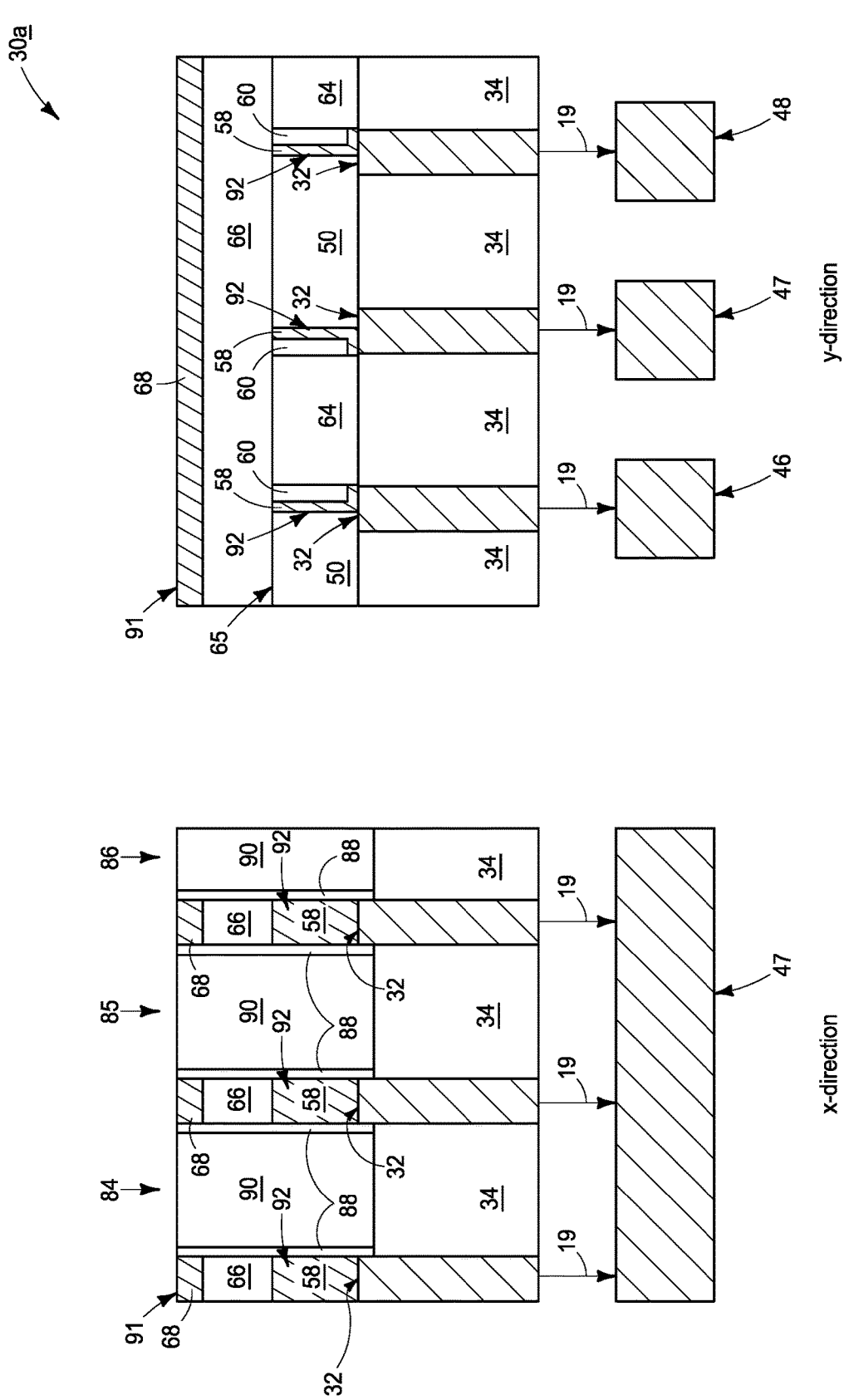
FIGS. 14-16 show cross-sectional illustrations of a construction at processing stages subsequent that of FIG. 9 in accordance with another example embodiment.

Referring to FIG. 14, a construction 30a is shown at a processing stage subsequent to that of FIG. 9. The trenches 84-86 have been formed to extend through the heater material 58, the phase change material 66 and the capping material 68; and to extend partially into the insulative material 34. The trenches 84-86 may be patterned utilizing any suitable mask (not shown); including, for example, a photolithographically-patterned photoresist mask and/or a mask formed utilizing pitch multiplication methodologies.

Sidewall edges of the trenches 84-86 are lined with the insulative material 88, and then the remainder of the trenches is filled with the insulative material 90. Subsequently, the planarized surface 91 is formed extend across materials 68, 88 and 90.

The trenches 84-86 pattern lines of heater material 58 (with an example line being shown along the x-direction of FIG. 9) into the heater structures 92.

Referring to FIG. 15, the trenches 70-73 are formed to extend through the phase change material 66 and the capping material 68; and partially into the insulative materials 50 and 64. The trenches 70-73 may be patterned utilizing any suitable mask (not shown); including, for example, a photolithographically-patterned photoresist mask and/or a mask formed utilizing pitch multiplication methodologies.

Sidewall edges of the trenches 70-73 are lined with insulative material 74, and then the remainder of the trenches is filled with insulative material 76. Subsequent planarization forms the planarized surface 75 extending across the materials 68, 74 and 76, as well as across the materials 88 and 90.

In the embodiment of FIGS. 14 and 15, the trenches 84-86 formed at the processing stage of FIG. 14 may be referred to as first trenches, and the trenches 70-73 formed at the processing stage of FIG. 15 may be referred to as second trenches.

The construction of FIG. 15 is identical to that discussed above with reference to FIG. 11, except that the bitlines have not yet been formed. The construction of FIG. 15 comprises the memory cells 100 having confined phase change material structures 94.

FIG. 16 shows the construction 30a at a processing stage analogous to that of FIG. 13, and shows conductive bitline material 102 formed across the memory cells and patterned into bitlines 81-83.

The embodiments of FIGS. 10-16 form the trenches across the x-direction sequentially relative to those across the y-direction. In other embodiments, the trenches formed across the x-direction may be formed simultaneously with the trenches formed across the y-direction. For instance, FIG. 17 illustrates an example embodiment construction 30b at a processing stage subsequent to that of FIG. 9, in which the trenches are formed simultaneously across both the x and y directions.

Figure 17:
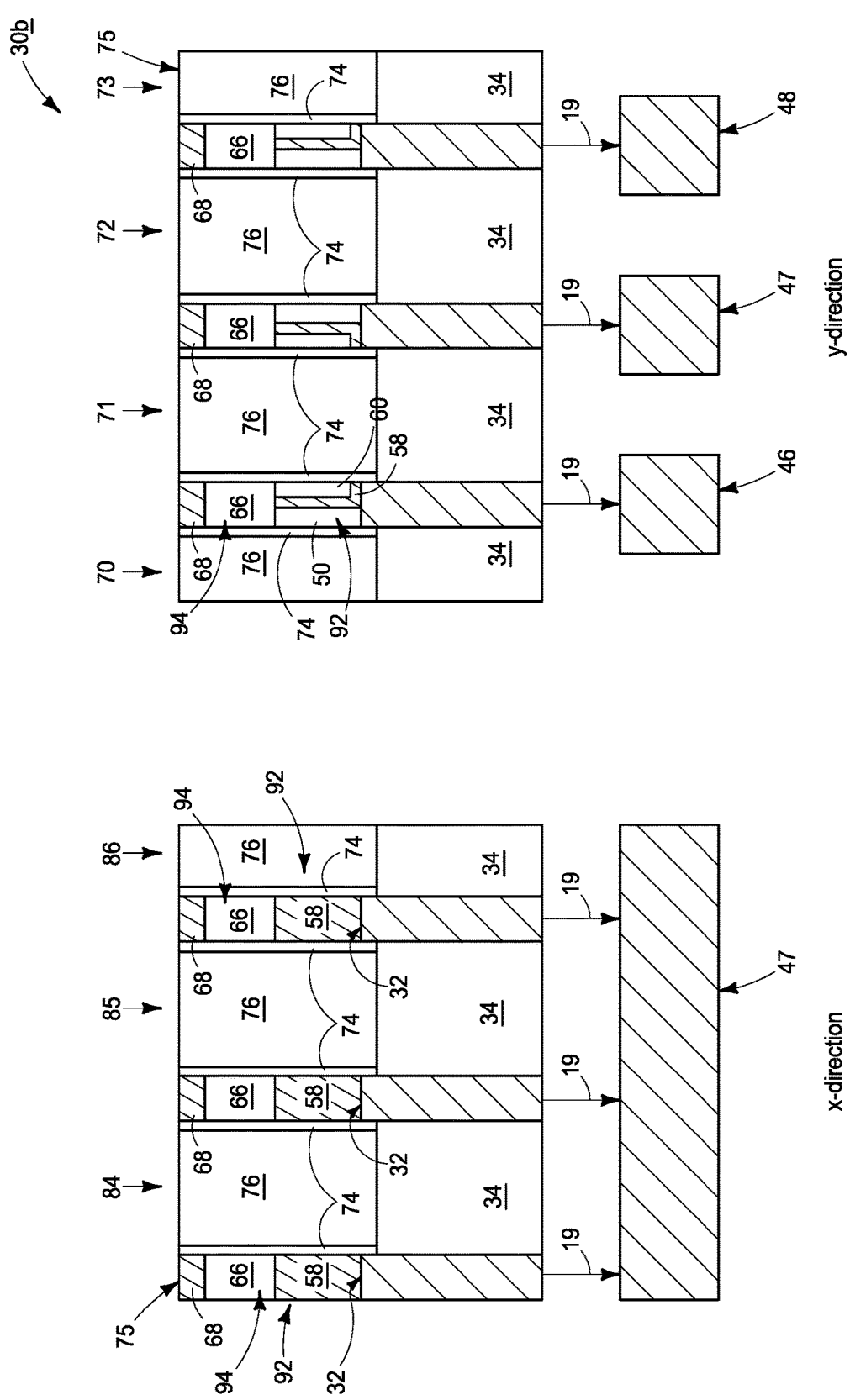
FIGS. 17 and 18 show cross-sectional illustrations of a construction at processing stages subsequent that of FIG. 9 in accordance with another example embodiment.

Specifically, FIG. 17 shows a processing stage after the trenches 84-86 have been formed to extend through the heater material 58, the phase change material 66 and the capping material 68; and after the trenches 70-73 have been formed to extend through the phase change material 66, the capping material 68, and the insulative materials 50 and 64 (with material 64 being shown in FIG. 9, and being entirely removed with the processing utilized to form the structure of FIG. 17). The trenches 70-73 and 84-86 may be patterned utilizing any suitable mask (not shown); including, for example, a photolithographically-patterned photoresist mask and/or a mask formed utilizing pitch multiplication methodologies. In some embodiments, the trenches 70-73 and 84-86 may be considered to be comprised by a lattice of trenches formed to punch through the various materials 50, 58, 64, 66 and 68 to simultaneously form the confined phase change material structures 94 and the heater structures 92.

Sidewall edges of the trenches 70-73 and 84-86 are lined with insulative material 74, and then the remainder of the trenches is filled with insulative material 76. It is noted that the same insulative material is formed along the edges of trenches 84-86 as is formed along the edges of trenches 70-73, and that all of the trenches are simultaneously lined with the insulative material.

After the trenches 70-33 and 84-86 are filled with desired insulative material, planarization is conducted to form the planarized surface 75 extending across the materials 68, 74 and 76.

In some embodiments, the construction of FIG. 17 may be considered to comprise confined phase change material structures 94 which are spaced from one another along the illustrated y-direction by insulative regions comprising oxide-containing material 76 sandwich between nitride-containing material 74; and which are also spaced from one another along the illustrated x-direction by insulative regions comprising oxide-containing material 76 sandwich between nitride-containing material 74. The insulative regions along the x-direction that comprise materials 74 and 76 are about the same depth as those along the y-direction.

Figure 18:
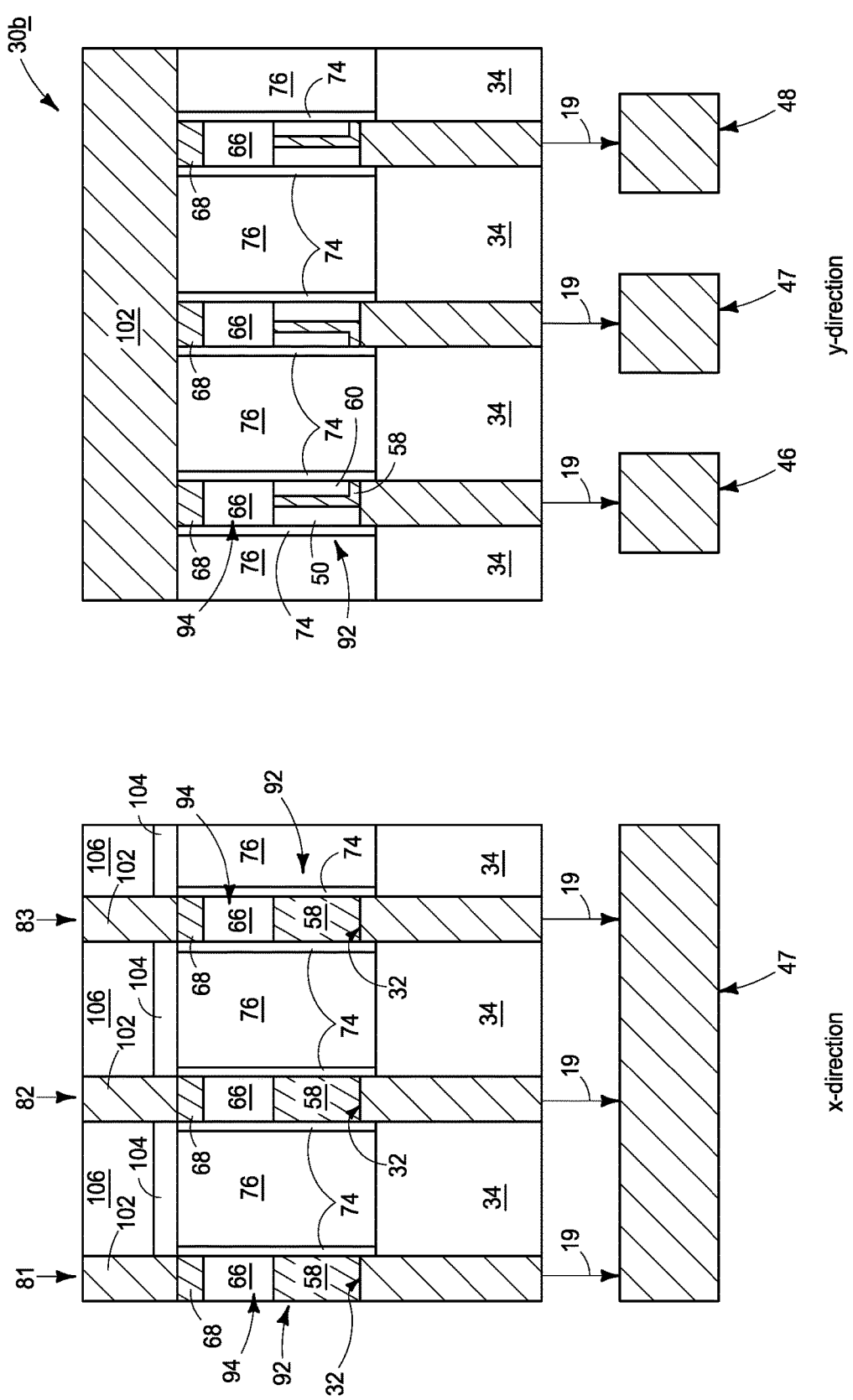

FIG. 18 shows the construction of FIG. 17 at a processing stage analogous to that of FIG. 13, and shows conductive bitline material 102 formed across the memory cells, and patterned into bitlines 81-83.

In the embodiment described above with reference to FIGS. 7-9, the expanse of heater material 58 of FIG. 7 is sliced into lines 61-63 prior to deposition of phase change material 66. In other embodiments, the heater material 58 may be patterned into lines 61-63 simultaneously with some of the patterning of the phase change material, as described with reference to an example embodiment process of FIGS. 19-23, which may reduce process steps in some embodiments.

Figure 19:
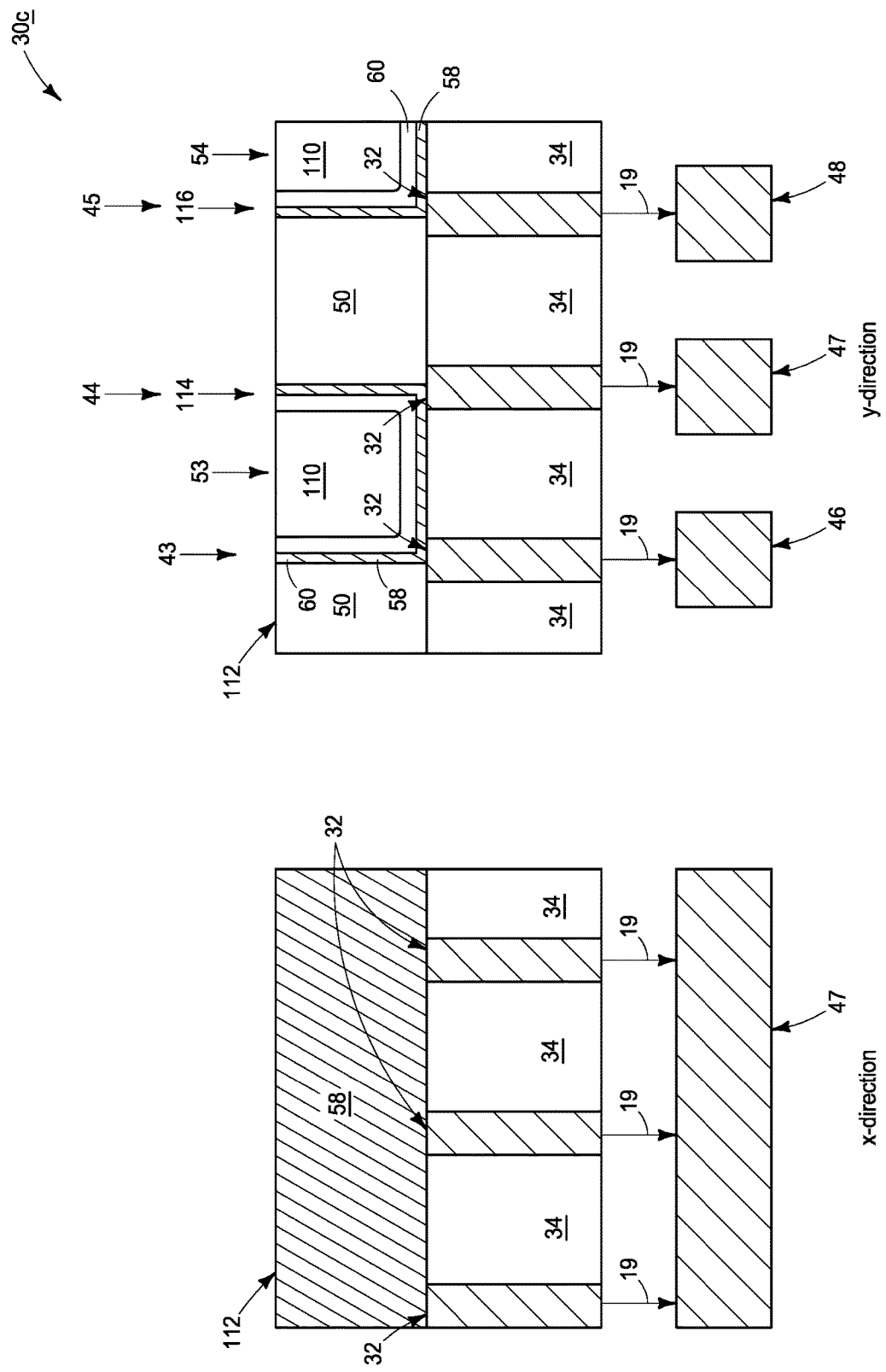
FIGS. 19-23 show cross-sectional illustrations of a construction at processing stages subsequent that of FIG. 7 in accordance with another example embodiment.

Referring to FIG. 19 a construction 30c is shown at a processing stage subsequent to that of FIG. 7. Insulative material 110 is formed within the gaps 53 and 54, and subsequently CMP or other appropriate planarization is utilized to remove materials 56 (FIG. 7), 58 and 60 from over material 50 and form the shown planarized upper surface 112. The heater material 58 remaining at the process stage of FIG. 8 is configured as strips 114 and 116 which extend along rows 43-45 of FIG. 5 (i.e., which extend along a direction of the axis 5 of FIG. 5). In the shown embodiment, the strips are configured as upwardly-opening containers. Each of the heater material strips is along paired rows of the array of FIG. 5 (i.e., each strip extends at least partially across nodes 32 from two adjacent rows). For instance, the strip 114 is along paired rows 43 and 44.

Figure 20:
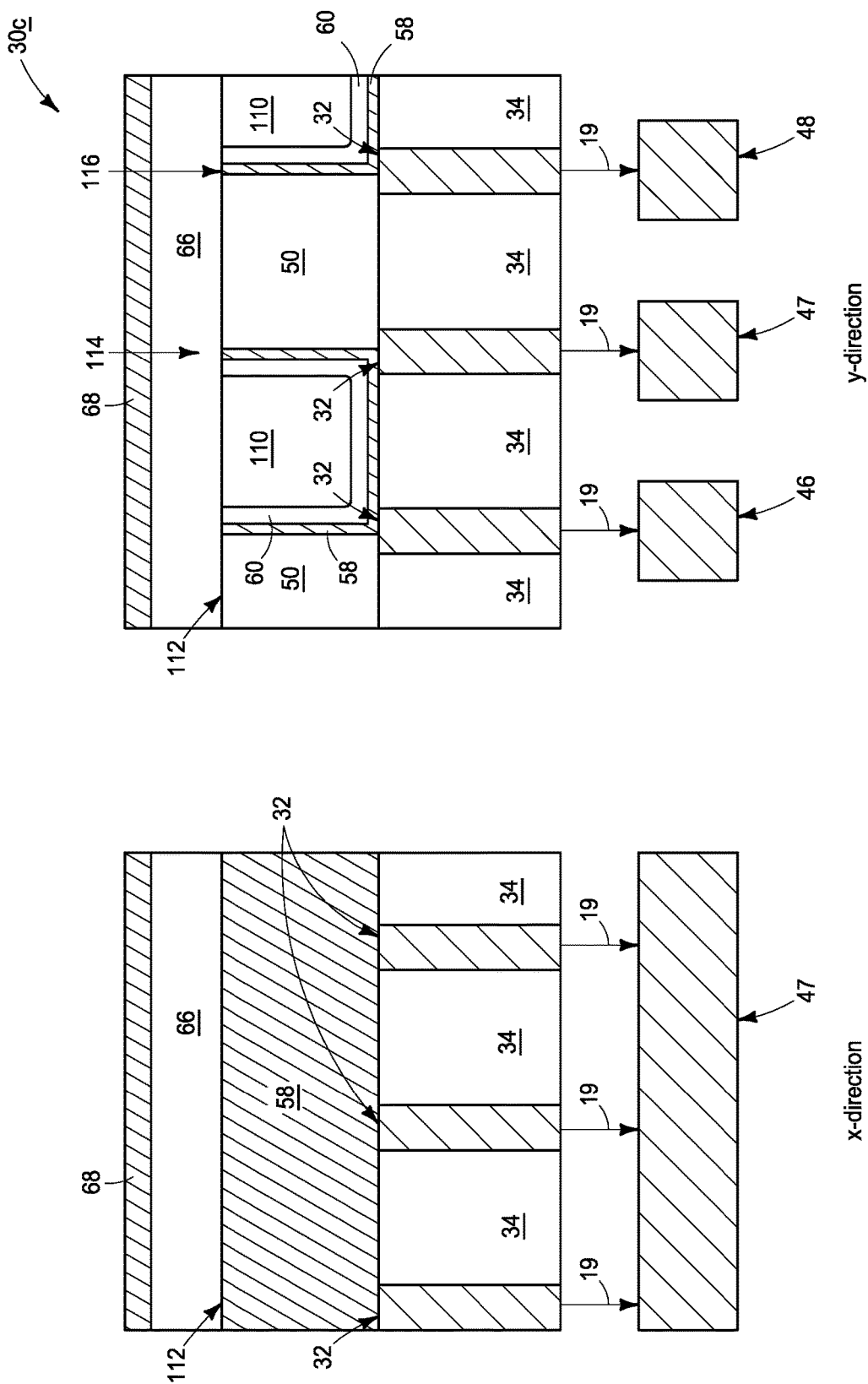

Referring to FIG. 20, phase change material 66 is formed on planarized surface 112, and accordingly is formed across the strips 114 and 116 of heater material 58; and capping material 68 is formed over the phase change material.

Figure 21:
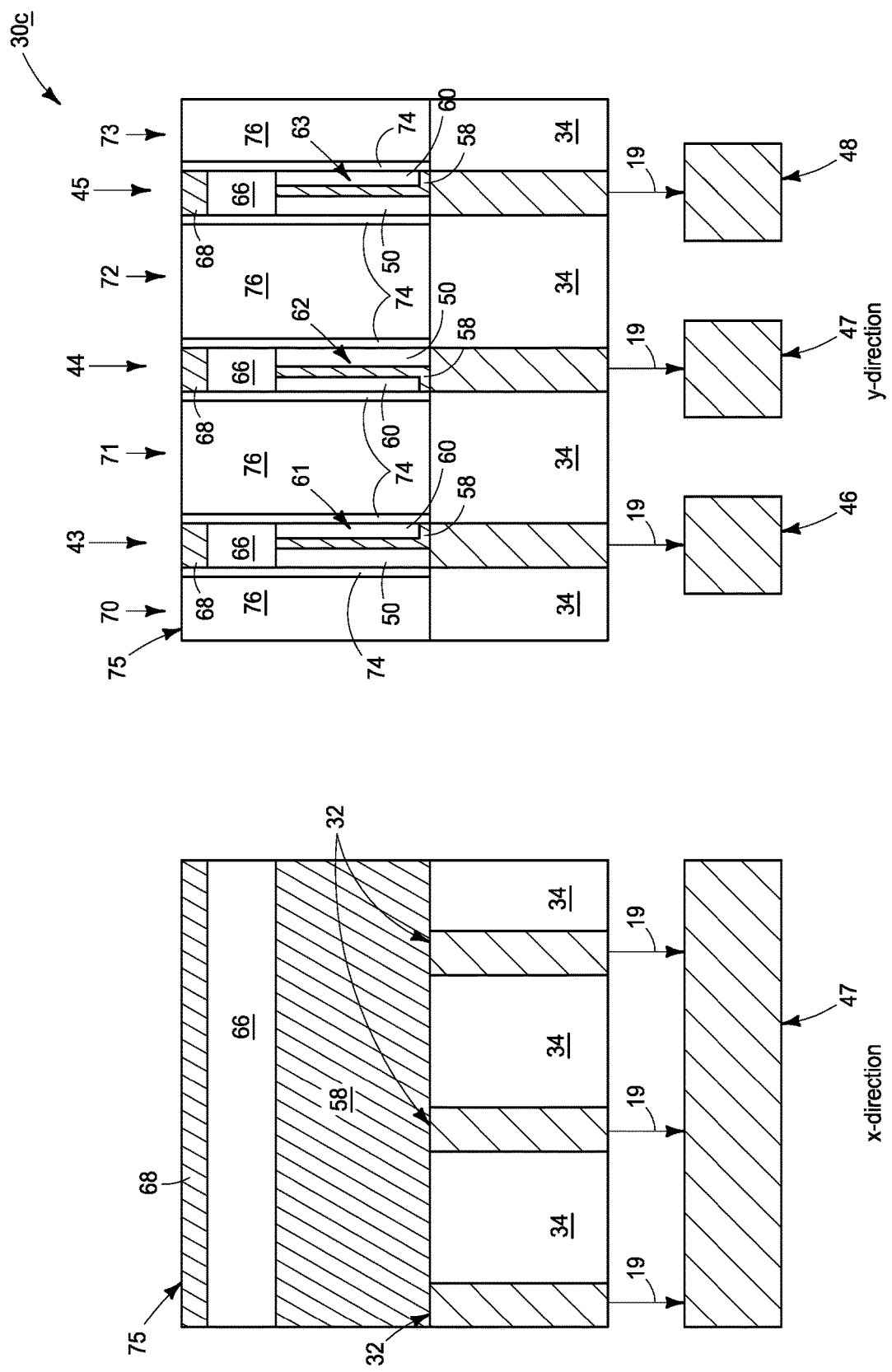

Referring to FIG. 21, trenches 70-73 are formed to extend through the phase change material 66, the capping material 68 and the insulative materials 50, 60 and 110 (the insulative material 110 is present at the processing stage of FIG. 20 and is entirely removed at the processing stage of FIG. 21 in the shown embodiment, but in other embodiments some of the insulative material 110 may remain at the processing stage of FIG. 21 depending on the widths of trenches 70-73 and the thicknesses of materials 58 and 60). The trenches 70-73 may be patterned utilizing any suitable mask (not shown); including, for example, a photolithographically-patterned photoresist mask and/or a mask formed utilizing pitch multiplication methodologies.

The trenches 70-73 cut the heater material strips 114 and 116 (FIG. 20) into heater material lines 61-63. Such lines are in one-to-one correspondence with rows 43-45 of the array of FIG. 5, as shown in the y-direction cross-section of FIG. 21 (with the lines 61-63 and rows 43-45 extending in and out of the page relative to the y-direction cross-section).

Sidewall edges of the trenches are lined with insulative material 74, and then the remainder of the trenches is filled with insulative material 76. Subsequently, planarization (for instance, CMP) may be conducted to form the shown planarized surface 75 extending across the materials 68, 74 and 76.

Figure 22:
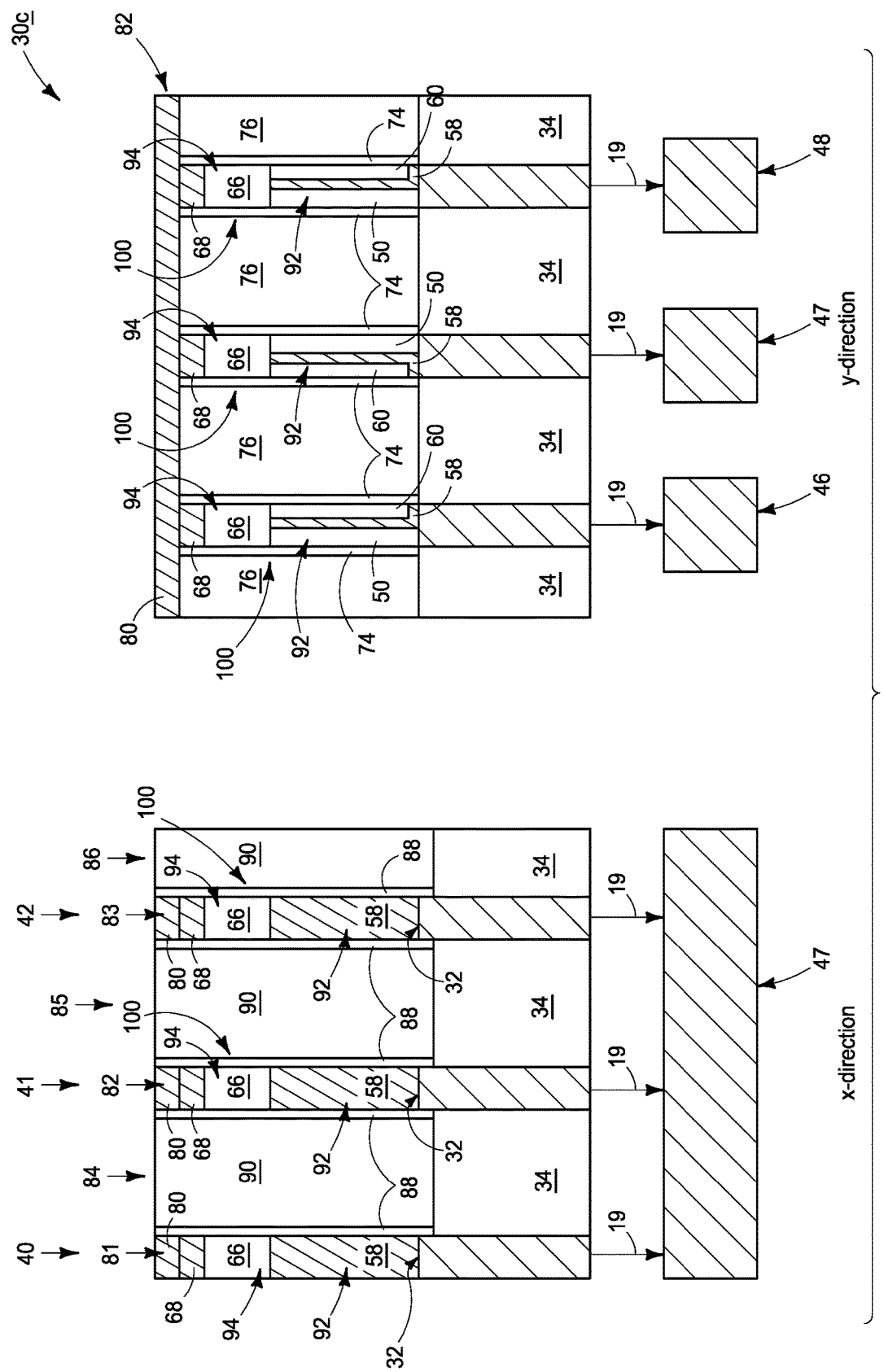

Referring to FIG. 22, bitline material 80 is formed over capping material 68 and patterned into bitlines 81-83. The bitlines are formed to be lines which extend along the same direction as columns 40-42 of FIG. 5 (i.e., which extend along the direction of axis 7 of FIG. 5), and accordingly the bitlines extend in and out of the page relative to the x-direction cross-section of FIG. 22.

Trenches 84-86 are formed to extend through the heater material 58, the phase change material 66 and the capping material 68. In the shown embodiment, the trenches also extend partially into the insulative material 34. The trenches are formed to extend along the same direction as columns 40-42 of FIG. 5 (i.e., to extend along the direction of axis 7 of FIG. 5), and accordingly extend in and out of the page relative to the x-direction cross-section of FIG. 22. In some embodiments, the bitlines 81-83 may be utilized as a hard mask during formation of trenches 84-86.

In some embodiments, the trenches 70-73 formed at the processing stage of FIG. 21 may be referred to as first trenches, and the trenches 84-86 formed at the processing stage of FIG. 22 may be referred to as second trenches.

Sidewall edges of the trenches 84-86 are lined with insulative material 88, and then the remainder of the trenches is filled with insulative material 90.

The trenches 84-86 pattern the lines 61-63 (FIG. 21) of heater material 58 into heater structures 92 which are in one-to-one correspondence with nodes 32, pattern the phase change material 66 into confined structures 94 which are also in one-to-one correspondence with nodes 32, and pattern the capping material 68 into blocks which are in one-to-one correspondence with the confined structures 94 of phase change material 66. Each confined structure of the phase change material is a within individual memory cell 100, and such memory cells form a memory array. Each memory cell may be uniquely addressed through the combination of a wordline (for instance, one of the wordlines 46-48) and a bitline (for instance, one of the bitlines 81-83). In the shown embodiment, the heater structures 92 are angled plates analogous to the configuration of FIG. 2, but in other embodiments the heater structures may be formed to have other configurations.

In some embodiments, the various insulative materials 50, 74 and 88 of the embodiment of FIGS. 19-22 may be referred to as first, second and third insulative materials, respectively, in order to distinguish such insulative materials from one another. Such first, second and third insulative materials may comprise a same composition as one another (and may, for example, comprise silicon nitride) in some embodiments. In other embodiments, at least one of the first, second and third insulative materials may be of a different composition than at least one other of such first, second and third insulative materials.

Figure 23:
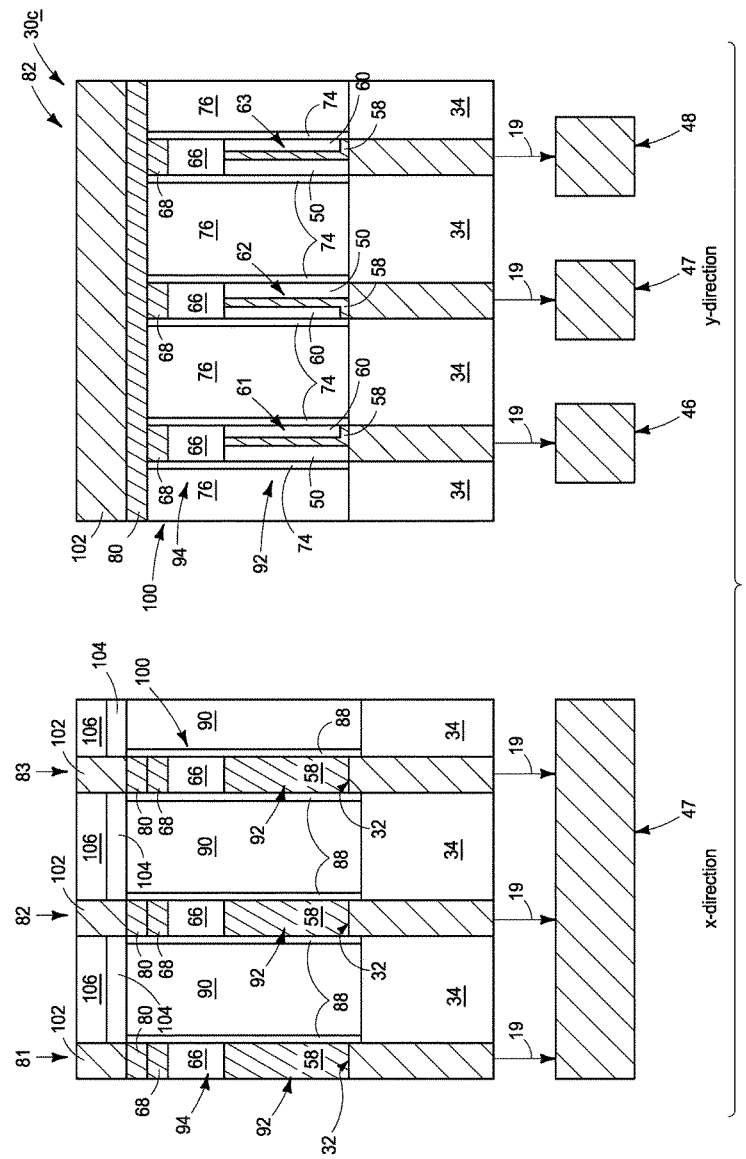

Referring to FIG. 23, construction 30c is shown at a processing stage analogous to that of FIG. 13, and specifically is shown after conductive bitline material 102 is formed across the memory cells and patterned into bitlines 81-83.

Embodiments analogous to that of FIGS. 19-23 may be utilized in combination with any of the other embodiments described previously in this disclosure. For instance, in some embodiments trenches are formed simultaneously across both the x and y directions (analogous to FIGS. 17 and 18), and the heater material structures may be patterned from strips in a manner analogous to that of FIGS. 19-20.

The utilization of phase change material in configurations confined to single memory cells may provide numerous advantages over conventional configurations. For instance, confinement of the phase change material may reduce programming current by reducing the thermal dispersion out of memory cell active material. Additionally, confinement of the phase change material to single memory cells may alleviate thermal disturb (crosstalk) between adjacent memory cells. Further, confinement of the memory material within single memory cells may mitigate segregation effects which occur in conventional configurations having continuous phase change material across memory cells, which may improve reliability of memory cells across a memory array.

In some embodiments, the various insulative materials deposited within trenches in the various embodiments may be deposited at low temperatures (for instance, temperatures no greater than about 400° C.) in order to avoid possible thermal degradation of various integrated structures which may be exposed to the thermal processing conditions utilized during deposition of the insulative materials.

The memory devices and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, a method of forming memory cells includes formation of a plurality of heater structures over an array of electrical nodes. The array has rows extending along a first direction and has columns extending along a second direction substantially orthogonal to the first direction. Wordlines are under the nodes and extend along the first direction. Phase change material is formed across the heater structures. The phase change material is patterned into a plurality of confined structures. The confined structures are spaced from one another by one or more insulative materials that entirely laterally surround each of the confined structures. Bitlines are formed across the confined structures. The bitlines extend along the second direction.

In some embodiments, a method of forming memory cells includes formation of lines of heater material over an array of electrical nodes. The array has rows extending along a first direction and has columns extending along a second direction substantially orthogonal to the first direction. Wordlines are under the nodes and extend along the first direction. The lines of heater material extend along the first direction and are along rows of the array. Chalcogenide is formed over the lines of heater material and across the array. First trenches are formed through the chalcogenide, with the first trenches extending along the first direction. The first trenches are lined with first insulative material. After forming and lining the first trenches, patterned bitline material is formed over the chalcogenide. The patterned bitline material form bitline material lines extending along the second direction. The patterned bitline material is utilized as a mask during formation of second trenches through the phase change material and the lines of heater material, with the second trenches extending along the second direction and patterning the heater material into heater structures while patterning the chalcogenide into confined structures. The second trenches are lined with second insulative material.

In some embodiments, a method of forming memory cells includes formation of lines of first insulative material over an array of electrical nodes. The array has rows extending along a first direction and has columns extending along a second direction substantially orthogonal to the first direction. Wordlines are under the nodes and extend along the first direction. The lines of first insulative material extend along the first direction and are along paired rows of the array. The lines of first insulative material form an undulating topography across the array. An expanse of heater material is formed across the undulating topography. The expanse of heater material is planarized to remove the heater material from over the lines of first insulative material and thereby pattern the heater material into strips. The strips extend along the first direction and across paired rows of the array. The strips of heater material are configured as upwardly-opening containers. Chalcogenide is formed across the strips. First trenches are formed through the chalcogenide and the strips of heater material, with the first trenches extending along the first direction and cutting the heater material strips into lines of heater material that are in one-to-one correspondence with the rows of the array. The first trenches are lined with second insulative material. After forming and lining the first trenches, second trenches are formed through the phase change material and the lines of heater material, with the second trenches extending along the second direction and patterning the heater material into heater structures while patterning the chalcogenide into confined structures. The second trenches are lined with third insulative material. Bitlines are formed across the confined structures, with the bitlines extending along the second direction.

In some embodiments, a memory cell comprises a heater structure over an electrical node, and a confined phase change material structure over the heater structure. The confined phase change material structure is entirely laterally surrounded by one or more electrically insulative materials directly against an entirety of a lateral periphery of the confined phase change material structure.

In some embodiments, a memory array includes a plurality of heater structures over an array of electrical nodes. The heater structures are in one-to-one correspondence with the nodes. The array has rows extending along a first direction and has columns extending along a second direction substantially orthogonal to the first direction. Wordlines are under the nodes and extend along the first direction. Confined phase change material structures are over the heater structures and in one-to-one correspondence with the heater structures. The confined phase change material structures are spaced from one another by one or more insulative materials that entirely laterally surround each of the confined phase change material structures. Bitlines are across the confined phase change material structures. The bitlines extend along the second direction.

In compliance with the statute, the subject matter disclosed herein has been described in language more or less specific as to structural and methodical features. It is to be understood, however, that the claims are not limited to the specific feature8s shown and described, since the means herein disclosed comprise example embodiments. The claims are thus to be afforded full scope as literally worded, and to be appropriately interpreted in accordance with the doctrine of equivalents.

We claim:
1. The memory array, comprising:
heater structures over an array of electrical nodes; the heater structures being in one-to-one correspondence with the electrical nodes; the array having rows extending along a first direction and having columns extending along a second direction substantially orthogonal to the first direction; wordlines being under the electrical nodes and extending along the first direction;
confined phase change material structures over the heater structures and in one-to-one correspondence with the heater structures;
bitlines across the confined phase change material structures, with the bitlines extending along the second direction;
conductive material caps between and contacting the bitlines and the confined phase change material structures;
the confined phase change material structures having lateral peripheries of phase change material; and
wherein:
the array has x-direction axes extending through the confined phase change material structures along the first direction and has y-direction axes extending through the confined phase change material structures along the second direction;
the confined phase change material structures and conductive material caps are spaced from one another along the x-direction axes by first insulative material regions comprising a first oxide-containing material having a first pair of opposing vertical sidewalls sandwiched between first nitride-containing materials that extend vertically along an entirety of the first pair of opposing vertical sidewalls;
the confined phase change material structures and conductive material caps are spaced from on another along the y-direction axes by second insulative material regions comprising a second oxide-containing material having a second pair of opposing vertically extending sidewalls sandwiched between second nitride-containing materials that extend vertically along an entirety of the second pair of opposing vertically extending sidewalls;
the first and second nitride-containing materials are silicon nitride; and
the lateral peripheries of the confined phase change material structures, the conductive material caps and the heater structures are entirely laterally surrounded by the first and second nitride-containing materials.
2. The memory array of claim 1 wherein the heater structures are configured as angled plates.
3. The memory array of claim 1 wherein the heater structures are configured as solid rods.
4. The memory array of claim 1 wherein the heater structures are configured as hollow tubes.
5. The memory array of claim 1 wherein the second insulative material regions are about a same depth as the first insulative material regions.

* * * * *